(12) United States Patent
Kasama

(10) Patent No.: US 7,819,252 B2
(45) Date of Patent: *Oct. 26, 2010

(54) WAFER CONTAINER WITH CUSHION SHEET

(75) Inventor: Nobuyuki Kasama, Tokyo (JP)

(73) Assignee: Miraial Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/499,520

(22) Filed: Jul. 8, 2009

(65) Prior Publication Data

US 2009/0266740 A1    Oct. 29, 2009

Related U.S. Application Data

(63) Continuation of application No. PCT/JP2008/050623, filed on Jan. 18, 2008.

(30) Foreign Application Priority Data

Jan. 24, 2007    (JP) .............................. 2007-013230

(51) Int. Cl.
*B65D 85/00* (2006.01)
*B65D 21/032* (2006.01)
(52) U.S. Cl. ...................................... 206/710; 206/509
(58) Field of Classification Search ................. 206/710, 206/454, 455, 503, 509, 303, 445, 449, 832, 206/308.1, 307, 309, 499, 516; 211/41.18; 220/23.6
See application file for complete search history.

(56) References Cited

U.S. PATENT DOCUMENTS

| 7,588,150 B2* | 9/2009 | Kasama ....................... 206/710 |
| 2002/0144927 A1* | 10/2002 | Brooks et al. ................ 206/710 |
| 2009/0038987 A1* | 2/2009 | Hyobu ......................... 206/712 |
| 2009/0050518 A1 | 2/2009 | Kasama |

FOREIGN PATENT DOCUMENTS

| JP | 10-050815 | 2/1998 |
| JP | 2003-168731 | 6/2003 |
| JP | 2005-191419 | 7/2005 |
| JP | 2009-170780 | 7/2009 |

OTHER PUBLICATIONS

International Search Report (in English), mailed Feb. 12, 2008.
Written Opinion of the International Searching Authority (with English translation), mailed Feb. 12, 2008.
International Preliminary Report on Patentability issued Jul. 28, 2009.

* cited by examiner

*Primary Examiner*—J. Gregory Pickett
(74) *Attorney, Agent, or Firm*—Harness, Dickey & Pierce, P.L.C.

(57) ABSTRACT

A wafer container with wafer-mounting cushion sheets prevents breaking and damage of semiconductor wafers due to impacts or repetitive warping by maintaining the semiconductor wafer in a flat state and enables the semiconductor wafer to be removed safely and easily without damage. The surface of each wafer-mounting cushion sheet includes a self-sucking portion for exerting a removable vacuum on the semiconductor wafer and a non-sucking portion for enabling separation of the semiconductor wafer.

8 Claims, 22 Drawing Sheets

(a)

(b)

(a)

(b)

WAFER CONTAINER WITH CUSHION SHEET

BACKGROUND

1. Technical Field

This disclosure relates to a wafer container with cushion sheets in which semiconductor wafers are set, carried and stored

2. Description of the Related Art

Thin semiconductor wafers are commonly stored in a wafer container so as prevent them from being broken, damaged and polluted when they are carried and stored during semiconductor manufacturing processes. Several containers have been proposed for use as such a wafer container. For example, one type of wafer container includes plural stacked wafer-mounting trays, and each semiconductor wafer is individually stored in an interior space formed between two wafer-mounting trays so that each wafer can be independently and safely stored. Hereinafter, "a wafer-mounting tray" means "a tray that mounts a wafer or wafers." (For example, see JP2003-168731.)

Another type of wafer container includes cushion sheets in which one wafer is sandwiched between two cushion sheets in the interior space formed between two stacked wafer-mounting trays in order to safely store a semiconductor wafer that has become brittle by recent ultrathinning, such as an ultrathin semiconductor wafer that is 200 micrometers or less in thickness. In such a case, since the semiconductor wafer is sandwiched between two cushion sheets, it is protected from being broken and damaged by external forces such as vibration or impact. (For example, see JP2005-191419.)

Although the semiconductor wafer is kept flat when it is sandwiched between the two cushion sheets of two stacked wafer-mounting trays, the semiconductor wafer become warped by the existence of internal stress when the wafer-mounting trays are separated and the semiconductor wafer is no longer sandwiched between the cushion sheets. If such a variation in the sandwiched and not-sandwiched states is repeated many times, the semiconductor wafer may be broken and damaged. Further, even though the semiconductor wafer is theoretically always kept flat by being adhered on the cushion sheet, an ultrathin semiconductor wafer may be broken and damaged by the strong adhesive force when the wafer is separated from the cushion sheet.

SUMMARY

In view of the foregoing, one purpose of the disclosure is to provide a wafer container with cushion sheets that allow a semiconductor wafer to be removed without being broken and damaged when the semiconductor wafer is taken out of the wafer container. In addition, the semiconductor wafer stored in the wafer container can be prevented from being broken and damaged by impacts during conveyance, and damage and breakage of the semiconductor wafer due to repeated warping can be prevented since the semiconductor wafer is always kept flat.

To achieve the above purposes, in the wafer container with the cushion sheets of one embodiment, a plurality of wafer-mounting trays are stacked, and semiconductor wafers are stored in the interior space formed between adjacent wafer-mounting trays. In addition, the wafer container has cushion sheets with elastic characteristics that are arranged at the positions where semiconductor wafers are placed on the upper surface of each wafer-mounting tray. The wafer-mounting cushion sheets have self-sucking portions, which removeably fix the semiconductor wafer thereto, and non-sucking portions, which keep the semiconductor wafer in a separable state. By changing an area density of the self-sucking portions, a fixing force, by which the wafer-mounting cushion sheet fixes the semiconductor wafer thereto, is adjusted from place to place on the wafer-mounting cushion sheet. In particular, the area density of the self-sucking portions in the central part of the wafer-mounting cushion sheet that fixes the central part of the semiconductor wafer is larger than that of the self-sucking portions in the outer circumference part of the wafer-mounting cushion sheet that fixes the outer circumference part of the semiconductor wafer. As a method to change the area density of the self-sucking portions, the ratio of the area density of the self-sucking portions and that of the non-sucking portions can be changed.

In addition, the non-sucking portions may be formed at a position facing part or all of the outer circumference part in the wafer-mounting cushion sheet that fixes the outer circumference part of the semiconductor wafer. In this case, the non-sucking portions may be formed to surround the circumference of the self-sucking portions formed in a circular shape with a smaller diameter than the semiconductor wafer, or may be formed so as to be separated into plural regions at a position facing the outer edge portion of the wafer-mounting cushion sheet. Also, the self-sucking portions may be formed so as to be separated into plural regions at a position facing the semiconductor wafer.

Also, the surface of the non-sucking portions may be formed so as to be the same in height as that of the self-sucking portions, or the non-sucking portions may be formed so that a sheet, which does not have fixing characteristics, is layered on the surface of the self-sucking portions. Also, the non-sucking portions may be formed so that a part of the surface of the self-sucking portions is converted to have non-sucking characteristics. In this case, the non-sucking portions may be formed so that a part of the surface of the self-sucking portions becomes concavo-convex.

Also, the self-sucking portions may be formed by many fine suction discs. These discs can suction to and fix the semiconductor wafer by pushing the semiconductor wafer on the discs. Such the self-sucking portions may be formed using an elastic polymer material, such as an elastomeric polymer material, a rubber polymer foam material, or a urethane polymer foam material.

Also, the wafer-mounting cushion sheets may be removeably fixed in the wafer-mounting trays. Alternatively, a wafer pressing cushion sheet having elasticity, with which the semiconductor wafer is pressed on the mounting cushion sheet, may be fixed on the back side of the wafer-mounting tray.

According to the embodiments, the self-sucking portions removeably fixing the semiconductor wafer are formed on the surface of the wafer-mounting cushion sheet. Consequently, not only can the semiconductor wafer be prevented from being broken and damaged by impacts during a transfer of the semiconductor wafer, but the breakage and damage of the semiconductor wafer can also be prevented from occurring due to repeated warping since the semiconductor wafer is always kept flat. In addition, since the self-sucking portions, which removeably fix the semiconductor wafer, and the non-sucking portions, which keep the semiconductor wafer in a separable state, are formed on the surface of the wafer-mounting cushion sheet, and since the fixing force, by which the self-sucking portions of the cushion sheet fix the semiconductor wafer thereto, is adjusted by not only the diameters of the suction discs but also by the area density of the self-sucking portions, the fixing force can be easily controlled and changed at various positions across the cushion sheet.

For example, the fixing force by which the wafer mounting cushion sheet fixes the outer circumference part of the semiconductor wafer can be made smaller than that by which the wafer mounting cushion sheet fixes the central part of the semiconductor wafer by making the area density of the self-sucking portions at the outer circumference part of the semiconductor wafer smaller than that of the area density of the self-sucking portions at the central part of the semiconductor wafer. As a result, the semiconductor wafer can be easily removed from the outer edge part of the wafer mounting cushion sheet, and the semiconductor wafer can be safely and easily taken out of the wafer container without being broken or damaged. For example, when the semiconductor wafer is removed from the self-sucking portions, air enters the self-sucking portions from the outer edge part of the wafer mounting cushion sheet and the fixed state disappears. In addition, since air enters the self-sucking portions toward the central part of the wafer mounting cushion sheet and thereby the fixed state disappears as the semiconductor wafer is detached toward the central part of the semiconductor wafer, the semiconductor wafer can be safely and easily taken out of the wafer container. In addition, in the case where the non-sucking portions are formed at a position facing part or all of the outer edge part of the wafer-mounting cushion sheet that fixes the outer edge part of the semiconductor wafer, when the semiconductor wafer is detached from the self-sucking portions, air enters the self-sucking portions from the outer edge part of the wafer mounting cushion and thereby the fixed state disappears, the semiconductor wafer can be safely and easily taken out of the wafer container.

DETAILED DESCRIPTION OF THE EMBODIMENTS

Figure 2:
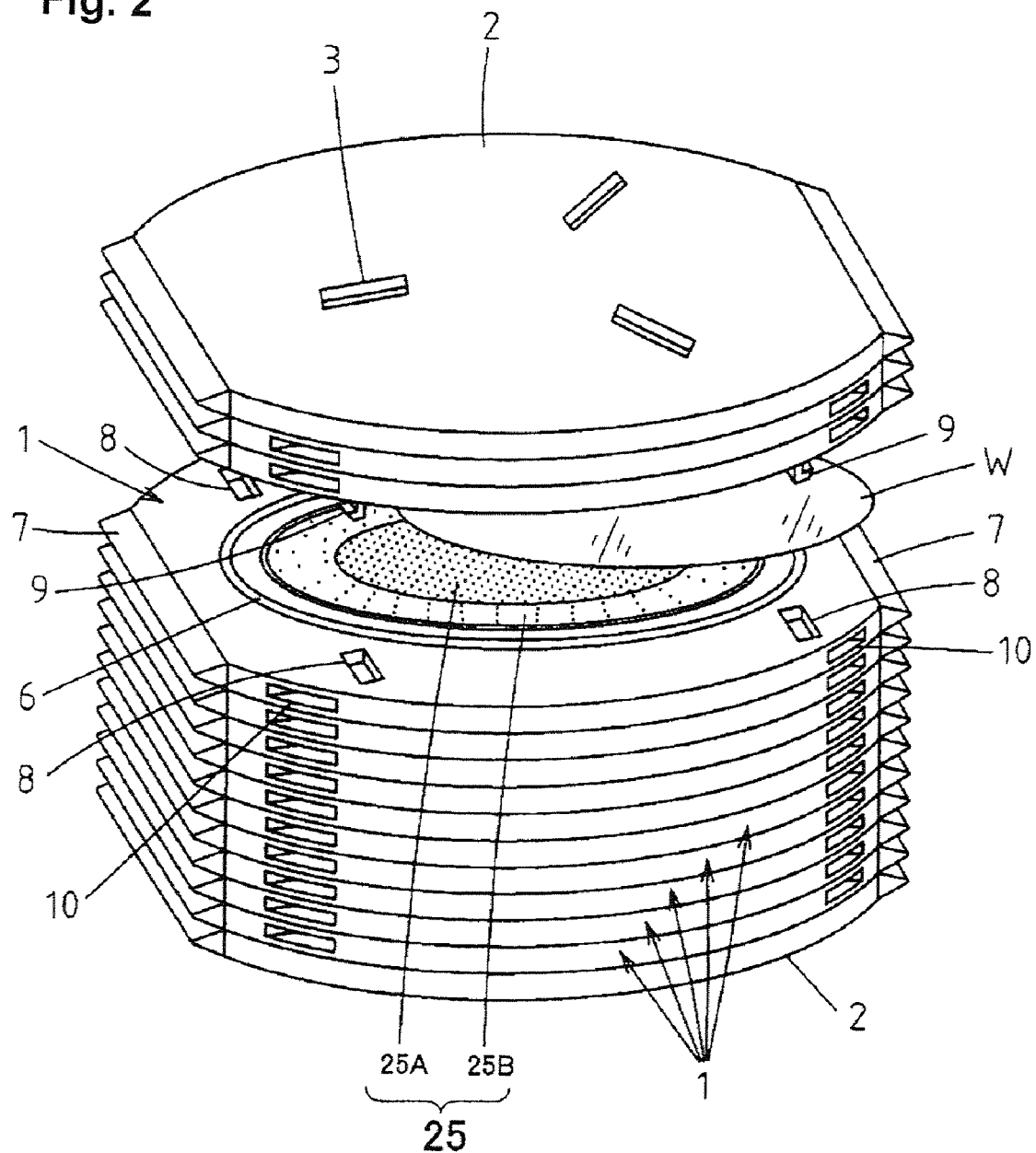
FIG. 2 is a perspective view of a total construction of a wafer container with wafer-mounting cushion sheets, in which several stacked wafer-mounting trays are separated.

Some embodiments are explained below with reference to the drawings. FIG. 2 shows a total construction of a wafer container with wafer-mounting cushion sheets. Plural wafer-mounting trays 1, where ultrathin semiconductor wafers formed into disc shapes are placed and stored, are stacked above and below in a horizontal state. In FIG. 2, a part of the stacked wafer-mounting trays is separated. Binding grooves 3 to join with a machine interface, which is not shown in FIG. 2, are prepared on base trays 2 placed on a top and a bottom of the stacked wafer-mounting trays.

Each of the wafer-mounting trays is made of a plastic material such as a polycarbonate resin. Since plural wafer-mounting trays 1 are superposed or stacked, a semiconductor wafer W put on the tray 1 is held in the internal space formed between adjacent trays 1. Then, the semiconductor wafer is put on a wafer-mounting cushion sheet (hereinafter called "mounting sheet") 25 fit on an upper face of the wafer-mounting tray 1.

The mounting sheet 25 includes self-sucking portions, which apply a vacuum to the semiconductor wafer to fix it place but allow it to be easily put on and taken off (that is, to removeably fix it). The mounting sheet 25 also includes non-sucking portions, which do not apply a vacuum to the semiconductor wafer and therefore keep the semiconductor wafer in a separable state. The mounting sheet 25 also includes a region 25A, where an area density of the self-sucking portions is large, and a region 25B, where an area density of the self-sucking portion is small. The details are described later. A circle seal member 6 made of a flexible material is arranged at the position surrounding the outside of the mounting cushion 25 over the entire circumference. A gripper 7 is formed at the 180-degree symmetry site in the outer edge of each wafer-mounting tray 1 so that it can be gripped by a mechanical apparatus.

Binding holes 8, with which a wafer-mounting tray 1 can join with the wafer-mounting tray 1 set just above it, are formed at, for example, four points in the outside of the circle seal member 6 on the upper face of each wafer-mounting tray 1. Each binding hook 9, which can be easily coupled and uncoupled with each binding hole 8, is convexly formed at, for example, four points corresponding to each hole downward from a rear face of each wafer-mounting tray. In this manner, a tray binding system, in which the trays are easily joined and released at the superposed position in the state where plural wafer-mounting trays are mutually superposed, comprise the binding holes 8 and the binding hooks 9. The engagement of each binding hole 8 and binding hook 9 can be released by inserting an unhooking key, which is not shown in FIG. 2, from a key outlet 10 and elastically deforming the binding hook 9.

Figure 3:
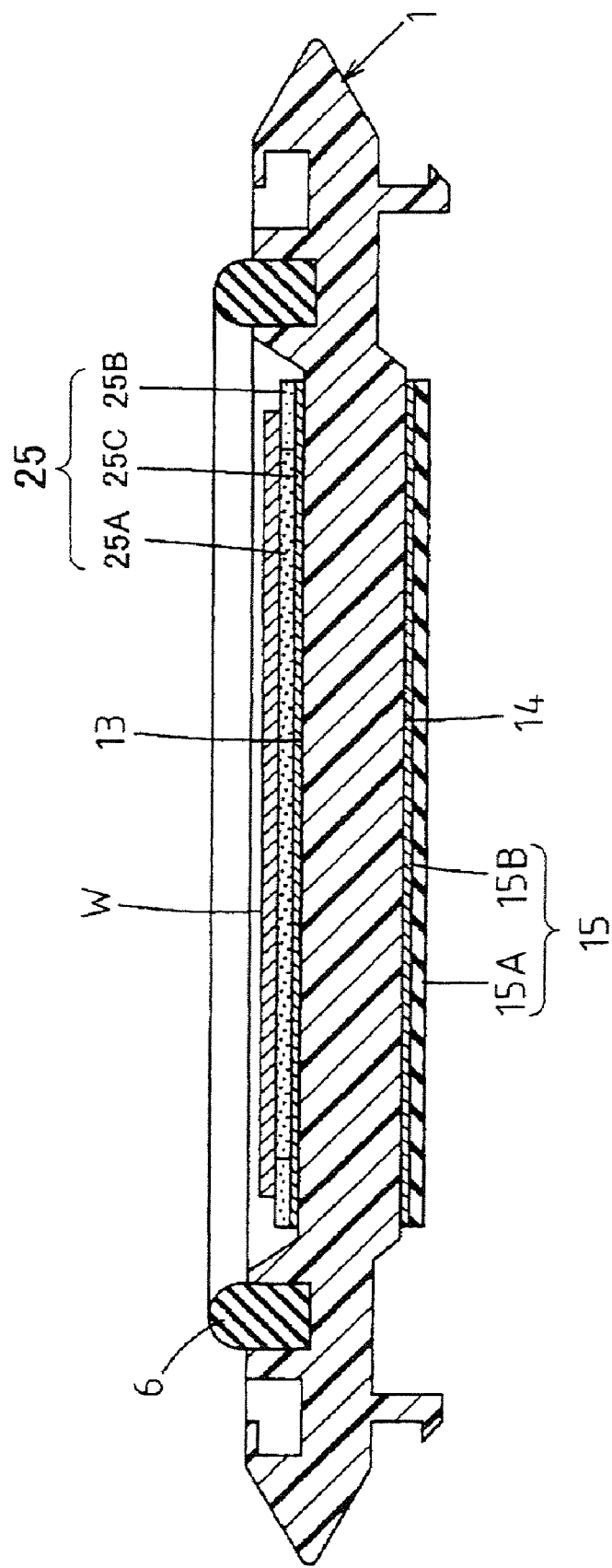
FIG. 3 is a side cross-section view that shows a semiconductor wafer is mounted on one wafer-mounting tray with a wafer-mounting cushion sheet.

FIG. 3 shows a state where a semiconductor wafer W is put on a wafer-mounting tray 1. The sectional view is taken along a meandering line so that the cross-sectional faces of the binding hooks etc. are shown in the drawing. The circle seal member 6 is arranged in a state where the lower half of it is fit in the circle groove formed slightly inside of the outer edge in the upper face of each wafer-mounting tray 1. In each wafer-mounting tray 1, the inside portion of the circle seal member 6 is formed in a dish shape where both the upper face and lower face drop down. A mounting cushion 25 is set on the upper face 13.

The mounting cushion 25 is formed in a disc shape where nearly an entire area of a semiconductor wafer can be put. Also, the mounting cushion 25 is made of a material that does not chemically influence the semiconductor wafer W, for example, in which the generation of an impurity gas is less than a defined value in all parts of the mounting cushion 25.

The mounting cushion 25 of FIG. 3 is two-layered. That is, the back side of the mounting cushion 25, which faces the upper face 13 of the wafer-mounting tray 1, comprises a base material sheet 25C made of a material such as PET (Polyethylene terephthalate). The surface side, which faces the semiconductor wafer W, also shown in FIG. 4, includes a region 25B, where an area density of the self-sucking portions is small, that surrounds an entire circumference of a region 25A, where an area density of the self-sucking portions is large. Thus, the mounting cushion 25 comprises two layers of the back side and the surface side that are stacked and unified.

As shown in FIG. 3, in this embodiment, the base material sheet 25C is attached to the upper face 13 of the wafer-mounting tray 1. The mounting cushion 25 can be constructed so as to be freely attached to or removed from the upper face 13 of the wafer-mounting tray 1. By fixing the base material sheet 25C (or freely mounting or dismounting) to frames or pins etc., the mounting cushion 25 can be freely attached to or removed from the upper face 13 of the wafer-mounting tray 1. Since the mounting cushion 25 can be constructed so as to be freely attached to or removed from the upper face 13 of the wafer-mounting tray 1 similarly to a disc-shaped sheet, it can be easily washed and exchanged. In this case, the fixing force between the wafer-mounting tray 1 and the mounting cushion 25 needs to be larger than that between the semiconductor wafer W and the mounting cushion 25. To accomplish this, for example, an area density of the self-sucking portions, which is a ratio of an area of the self-sucking portions to an entire area of the surface side, in the surface side of the base material sheet 25C, may be made smaller than that of the self-sucking portions, which is a ratio of an area of the self-sucking portions to an entire area of the back side of the base material sheet 25C.

Figure 10:
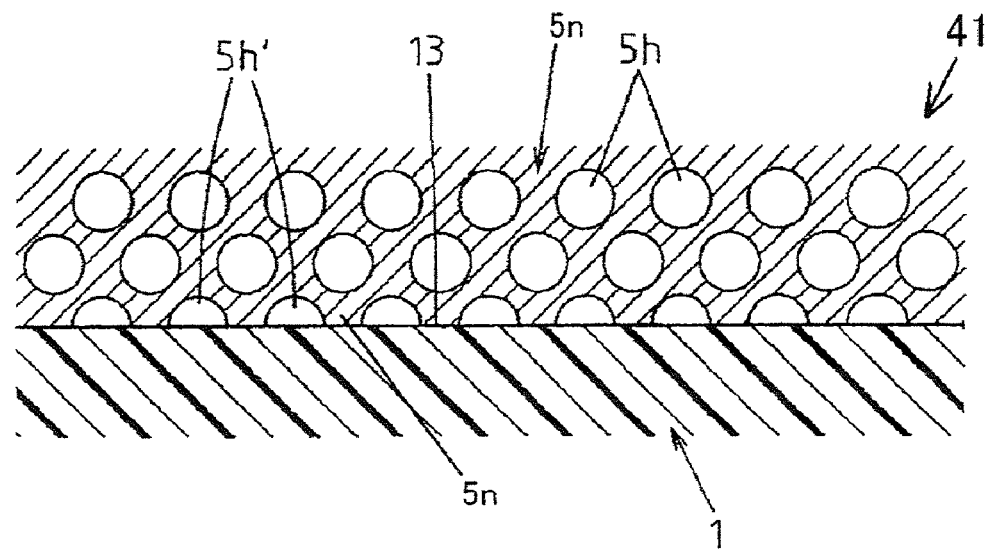
FIG. 10 is a side cross-sectional diagram that shows a structure of a suction layer in a wafer-mounting cushion sheet.

A self-sucking portion described herein means a portion having a material characteristic allowing it to form a suction bond with a plate or the like such as a semiconductor wafer. For example, FIG. 10 shows a structure of a suction layer in the wafer-mounting cushion sheet wherein many air bubbles 5$h$ are formed in a layer 41 of foam. Air bubbles 5$h'$ of the bubbles 5$h$ are outwardly opened along the surface of the suction layer, and each of them functions as a fine suction disc. The portion of suction layer 41 where there are no bubbles is denoted as region 5$n$. When a plate such as a semiconductor wafer is pressed into the suction layer 41, the outwardly opened air bubbles 5$h'$ are constricted. After that, when the force pressing the semiconductor wafer disappears or weakens and the air bubbles recover to their former state or a state close to normal, the semiconductor wafer 1 is fixed because the insides of the air bubbles 5$h'$ have a reduced pressure which creates a vacuum. Accordingly, the self-sucking portions are the area of the suction layer 41 including the outwardly opened air bubbles on the surface of the mounting cushion. When an external force is applied to separate the semiconductor wafer fixed by the self-sucking portions, such as a force to lift the semiconductor wafer, since the semiconductor wafer is not fixed in the portion 5$n$ that does not have air bubbles, outer air enters the air bubbles 5$h'$. As a result, the low pressure state in the bubbles 5$h'$ disappears and the semiconductor wafer separates from the self-sucking portions.

A non-sucking portion described herein is the portion whose material characteristics does not allow it to become fixed to a plate or the like such as a semiconductor wafer and therefore keeps the plate in a non-bonded and separable state. The non-sucking portion is the portion that is not the self-sucking portions, or the area that does not have the suction layer.

The surface of the mounting cushion has the self-sucking portions that vacuum bond with a semiconductor wafer and the non-sucking portions that do not vacuum bond with the semiconductor wafer and keep the separable state. Accordingly, the fixing force by which the mounting cushion retains a semiconductor wafer is controlled by the ratio between the area of the self-sucking portions and the area of the non-sucking portions in the region where the semiconductor wafer and the mounting cushion contact one another. When S is an area of the portion where the semiconductor wafer and the mounting cushion overlap, SA is an area of the self-sucking portions of S, and SB is an area of the non-sucking portions of S, the ratio of the area of the self-sucking portions to S, which is called an area density of the self-sucking portions, is SA/(SA+SB)=SA/S. This means that the fixing force by which the mounting cushion retains a semiconductor wafer is dependent on SA/S. That is, the fixing force is large if SA/S is large, and it is small if SA/S is small. To increase the area density of the self-sucking portions, the area of the self-sucking portions may be increased and/or the area of the non-sucking portions may be decreased. Meanwhile, to decrease the area density of the self-sucking portions, the area of the self-sucking portions may be decreased and/or the area of the non-sucking portions may be increased In the mounting cushion described above, the fixing force by which the mounting cushion retains the semiconductor wafer is adjusted by the area density of the self-sucking portions. That is, by changing the area density of the self-sucking portions, the fixing force of the mounting cushion can be changed. Particularly, the fixing force acting on the outer circumference of the semiconductor wafer can be decreased by decreasing the area density of the self-sucking portions in the outer circumference of the mounting cushion contacting with the outer circumference of the semiconductor wafer. By gradually withdrawing the semiconductor wafer from the mounting cushion in the direction of the central portion from the outer circumference of the semiconductor wafer, for example, in FIG. 3, the semiconductor wafer W can be easily separated from the mounting cushion and removed from the wafer-mounting tray 1.

Next, a method of changing the area density of the self-sucking portions of the mounting cushion is explained.

Figure 11:
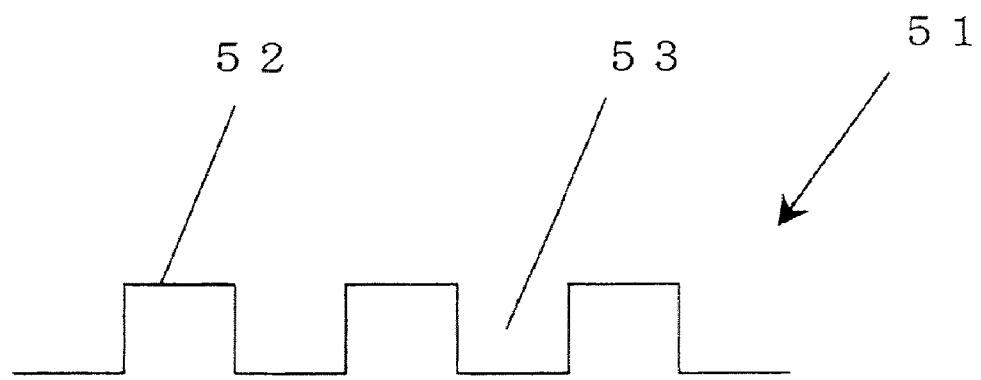
FIG. 11 is a diagram that shows a method to change an area density of the self-sucking portions.

FIG. 11 is a schematic diagram in the case where the surface of the mounting cushion 51, which comprises a single material and has only the self-sucking portions (that is, only the suction layer), has a concavo-convex shape. The mounting cushion 51 is made of a single material such as an elastomer polymer foam, a rubber polymer foam, or a urethane polymer foam. Alternatively, it may be made of complexes of these. The surface of the mounting cushion 51 has a concavo-convex shape, that is, it comprises convex portions 52 and concave portions 53. The top surface of the convex portions 52 is flat. It is desirable that all of the convex portions 52 of the mounting cushion have substantially the same height. When the semiconductor wafer is put on the mounting cushion 51 with the concavo-convex shaped surface, it contacts the convex portions 52 of the mounting cushion 51. Next, when the semiconductor wafer is pressed, the convex portions 52 contract. When the pressing force disappears, the portions contracted recover perfectly or to some degree. Since the convex portions 52 have the self-sucking function, the semiconductor wafer is subjected to a vacuum created along the top surface of the convex portions 52 of the mounting cushion. But since the semiconductor wafer does not contact with the surface of the concave portions 53, it is not subjected to a vacuum along the surface of the concave portions 53 of the mounting cushion. Although the semiconductor wafer may slightly contact the surface of the concave portions 53 when it is pressed on the mounting cushion, since the degree of the contraction of the surface along the concave portions 53 is much smaller than that of the contraction of the surface of the convex portions 52, the fixing force exerted by the concave portions is small. Consequently, the concave portions 53 of the mounting cushion are deemed to be separated from the semiconductor wafer when the pressing force disappears.

As described above, the portion exerting a vacuum on the semiconductor wafer and the portion not exerting a vacuum on the semiconductor wafer can be formed by making the surface of the mounting cushion the concavo-convex shape. When an area of the concave portions 52 in a given area is SV and an area of the convex portions 53 in the given area is SC, the area density of the self-sucking portions is SV/(SV+SC). Since the semiconductor wafer is retained under the fixing force of the mounting cushion 51, the fixing force under which the mounting cushion retains the semiconductor wafer in this region can be changed by changing the value of SV/(SV+SC) that is the area density of the sucking portions. That is, it is possible to decrease the fixing force under which the mounting cushion retains the semiconductor wafer in this region by reducing the area of the convex portions 52 in the surface of the region and increasing the area of the concave portions 53 there.

So, the area density of the self-sucking portions in the central part of the mounting cushion increases by increasing the convex portions 52 in the central part of the mounting cushion where the central part of the semiconductor wafer is set. Meanwhile, the area density of the self-sucking portions in the outer circumference part of the mounting cushion decreases by decreasing the convex portions 52 in the outer circumference part of the mounting cushion where the outer circumference part of the semiconductor wafer is set. Consequently, even though the outer circumference part of the semiconductor wafer is retained by the mounting cushion, the semiconductor wafer can be easily separated from the mounting cushion.

Next, another example that changes the area density of the self-sucking portions is explained.

Figure 12:
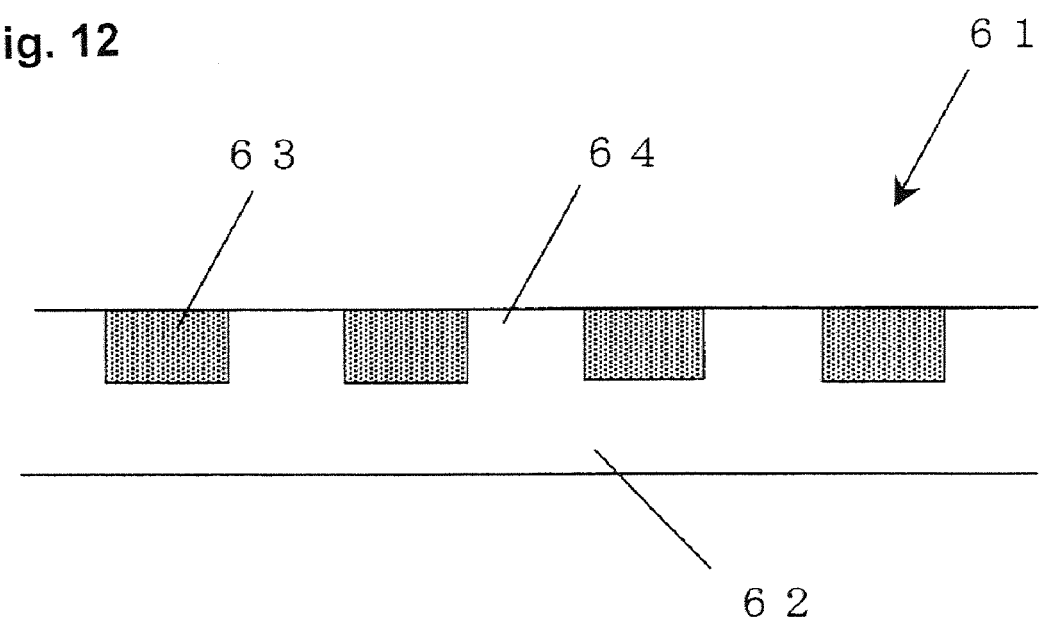
FIG. 12 is a diagram that shows another method to change an area density of the self-sucking portions.

FIG. 12 is an embodiment where the mounting cushion has a base material (non-sucking portions) 62 comprising a polymer material that does not have a self-sucking function, and the self-sucking portion comprising a polymer material that has a self-sucking function. After the surface of the base material 62 is formed in the concavo-convex shape, self-sucking portions are formed in the concave portions 63. There are several methods for forming the self-sucking portions. For example, a material (a polymer material) with the self-sucking function is coated on the surface of the base material with the concavo-convex shape and the concave portions 63 are filled with the material having the self-sucking function (a suction layer). Alternatively, a material (a polymer material) with the self-sucking function can be set (or embedded) in the concave portions 63. Since the surface of the convex portions 64 that does not have the self-sucking function (non-sucking portions) and the surface of the self-sucking portions can be formed virtually flat, the semiconductor wafer can be set on the surface of the mounting cushion 61 and can contact with the surface of the convex portions of the base material that does not have the self-sucking function (non-sucking portions) and can also contact with the surface of the self-sucking portions.

The base material not having the self-sucking function (non-sucking portions) may be a contractile material as well as having self-sucking portions. When the semiconductor wafer is pressed (pushed), both the self-sucking portions and the base material are constricted. When the force pressing the semiconductor wafer is removed or reduced, the constricted portions recover wholly or to some extent. Since the self-sucking portions 63 have the self-sucking function, the semiconductor wafer is retained by the mounting cushion. However, since the portions where the semiconductor wafer contacts with the non-sucking portions do not have the self-sucking function, the semiconductor wafer is not subjected to a vacuum by the portions of the base material of the mounting cushion.

As described above, the portions sucking and not sucking the semiconductor wafer can be formed by forming the self-sucking portions having the self-sucking function and the non-sucking portions not having the self-sucking function on the surface of the mounting cushion. When an area of the self-sucking portions is SS and an area of the non-sucking portions is SN in a given region, an area density of the self-sucking portions there is SS/(SS+SN). If the value of SS/(SS+SN) is large, the fixing force with which the mounting cushion retains the semiconductor wafer is large. If the value of SS/(SS+SN) is small, the fixing force with which the mounting cushion retains the semiconductor wafer is small. This means the area density of the self-sucking portions can be adjusted by changing the ratio of self-sucking portions and the area of the non-sucking portions.

Accordingly, the fixing force of the mounting cushion, which fixes the semiconductor wafer in various places of the mounting cushion, can be easily changed by changing the area density of the self-sucking portions at various locations. In the mounting cushion, the area density of the self-sucking portions in the central part of the mounting cushion increases by increasing the self-sucking portions in the central part of the mounting cushion where the central part of the semiconductor wafer is set. Meanwhile, the area density of the self-sucking portions in the outer circumference part of the mounting cushion decreases by decreasing the self-sucking portions in the outer circumference part of the mounting cushion where the outer circumference part of the semiconductor wafer is set. Consequently, the semiconductor wafer can be easily separated from the mounting cushion when the semiconductor wafer is withdrawn from the mounting cushion.

Another embodiment of forming the self-sucking portions and the non-sucking portions on the surface of the mounting cushion is shown in FIG. 12. Opposite to the method described above, using a single material (or composite materials) having the self-sucking function where the surface is concavo-convex, the self-sucking portions and the non-sucking portions can be formed on the surface of the mounting cushion by filling the concave portions with non-sucking portions not having the self-sucking function.

Alternatively, the self-sucking portions and the non-sucking portions can be formed on the surface of the mounting cushion by alternately forming (side-by-side) the material having the self-sucking function and the material not having the self-sucking function on the surface of the flat base material. For example, the self-sucking portions and the non-sucking portions can be formed alternately (side-by-side) by attaching the material having the self-sucking function and the material not having the self-sucking function on the surface of the flat base material, or by coating the material having the self-sucking function and the material not having the self-sucking function on the surface of the flat base material.

In FIG. 3, as described above, the self-sucking portions have cushioning characteristics and are made of materials that have low chemical harmful influence, for example, a rubber polymer foam such as an acrylic latex foam material comprising an acrylic ester copolymer, an elastomer polymer foam material, or urethane polymer foam material. In addition, each of the outwardly opening air bubbles of the many air bubbles formed in the self-sucking portions operates as a fine suction disc. Accordingly, the entire exposed faces in the self-sucking portions are the collective layers of the fine suction discs. The semiconductor wafer W is subjected to a vacuum and fixed by the self-sucking portions by pressing the semiconductor wafer into the fine suction discs. The air bubbles may be either continuous bubbles or isolated bubbles. Also, an average diameter of the bubbles is desirably around 10 micrometers or more and 50 micrometers or less.

Figure 4:
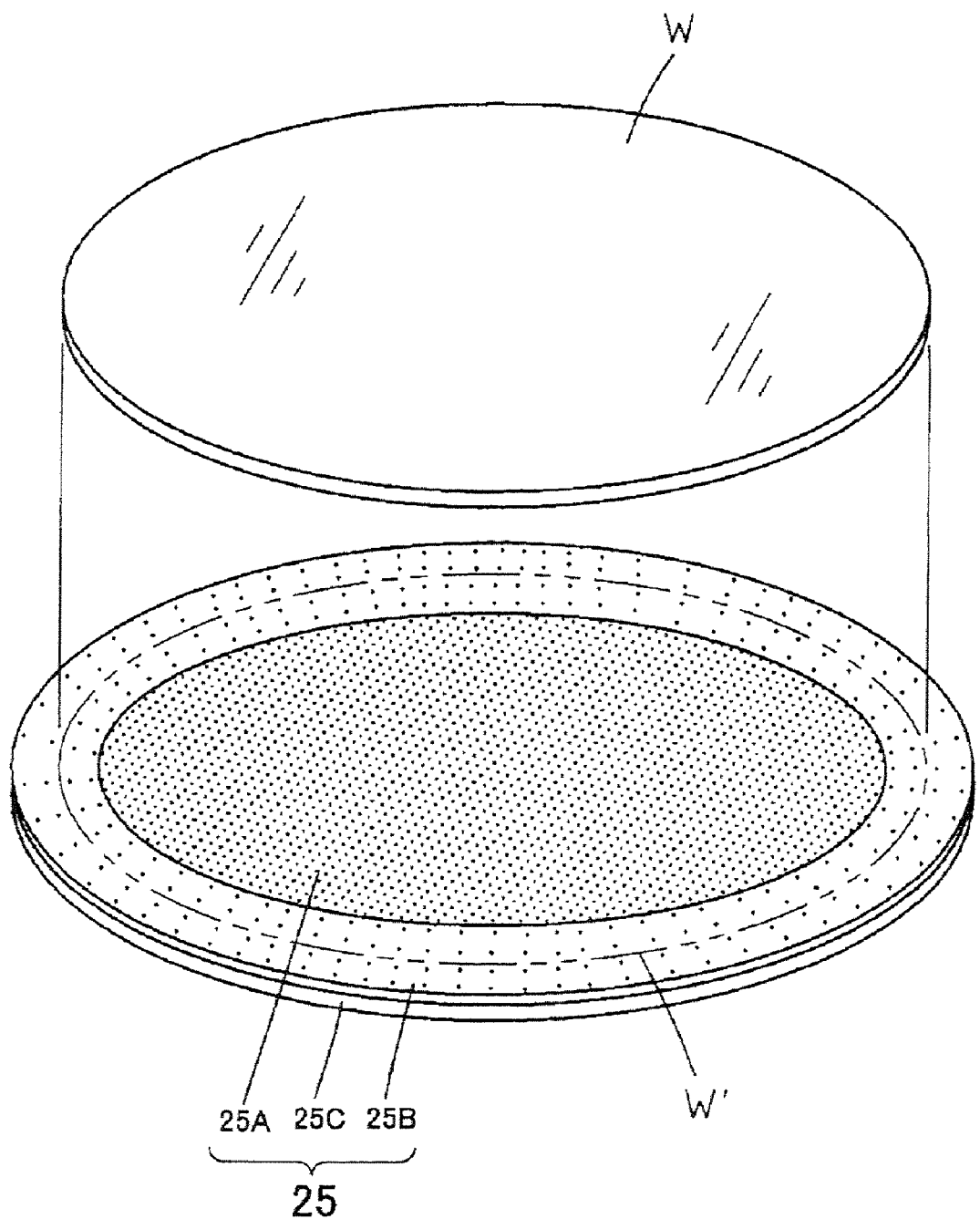
FIG. 4 is a perspective view that shows a wafer-mounting cushion sheet is separated from a semiconductor wafer.

As shown in FIG. 4, in this embodiment, the region 25A, where the area density of the self-sucking portions is large, is formed in the central part of the mounting cushion, that is, in a disc shape with a smaller diameter than the diameter of the semiconductor wafer. The region 25B, where the area density of the self-sucking portions is small, surrounds the entire circumference of the region 25A. W' shown by a two-dot chain line in FIG. 4 represents the outer edge of the semiconductor wafer when the semiconductor wafer is put on the mounting cushion 25. The outer edge of the region 25B, where the area density of the self-sucking portions is small, is formed to be larger than the semiconductor wafer W. The outer edge W' of the semiconductor wafer W lies inside of the region 25B where the area density of the self-sucking portions is small.

As a material of a non-sucking portion, a material that possesses the same degree of cushioning characteristics as the self-sucking portions and does not possess the self-sucking characteristics can be used such as, for example, a urethane polymer material such as urethane foam or an elastomer polymer material. In the mounting cushion 25 shown in FIG. 3, the area density of the self-sucking portions in the central region 25A of the mounting cushion 25, where the central part of the semiconductor wafer W is retained, is large, whereas, the area density of the self-sucking portions in the peripheral regions 25B of the mounting cushion 25, where the peripheral part of the semiconductor wafer W is retained, is small. Consequently, when the semiconductor wafer is pressed on the mounting cushion 25, the semiconductor wafer W can be safely and strain-freely stored since a repulsion force of the mounting cushion uniformly acts on the entire surface of the semiconductor wafer.

Figure 1:
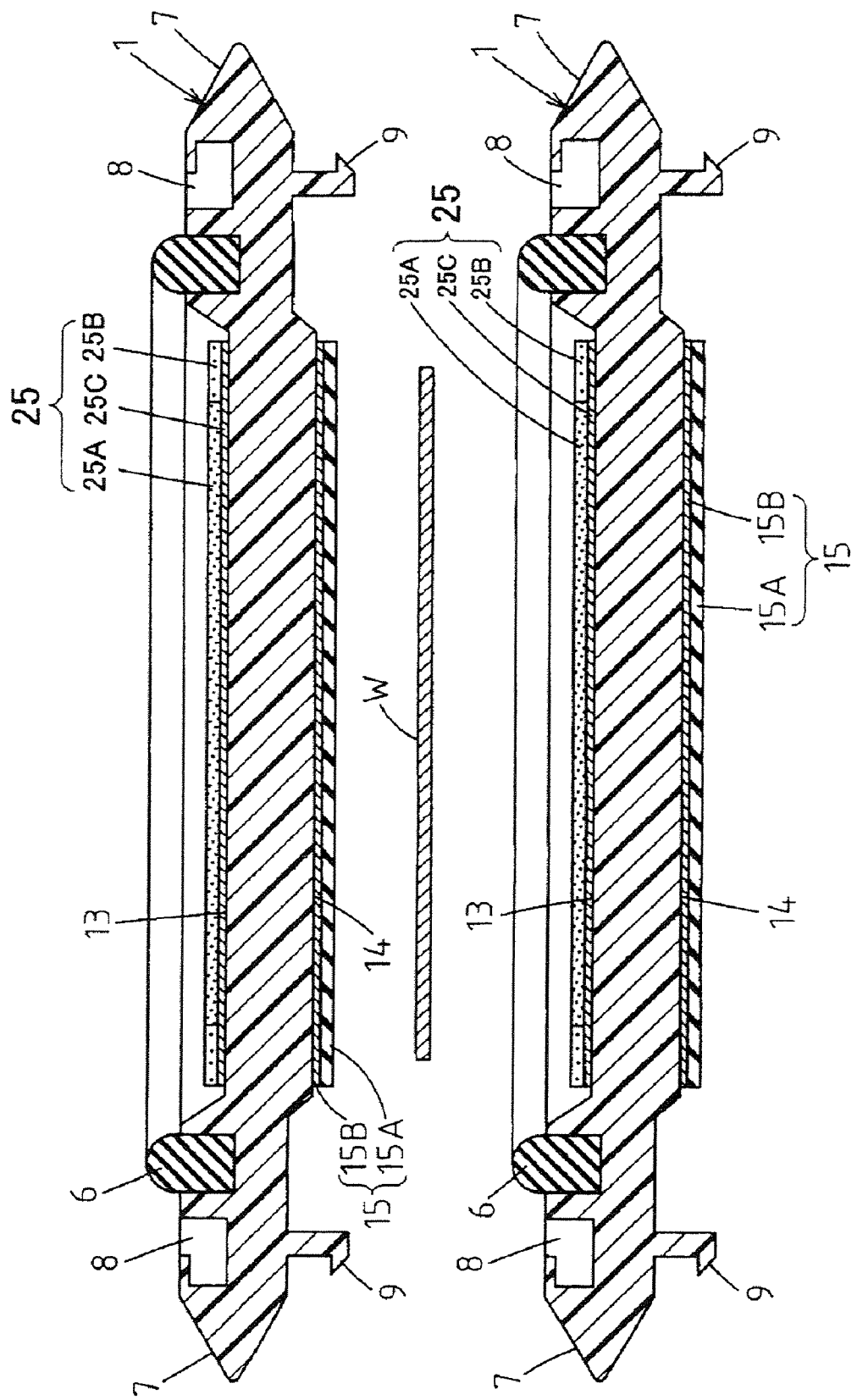
FIG. 1 is a side cross-section view that shows two separated wafer-mounting trays.
Figure 5:
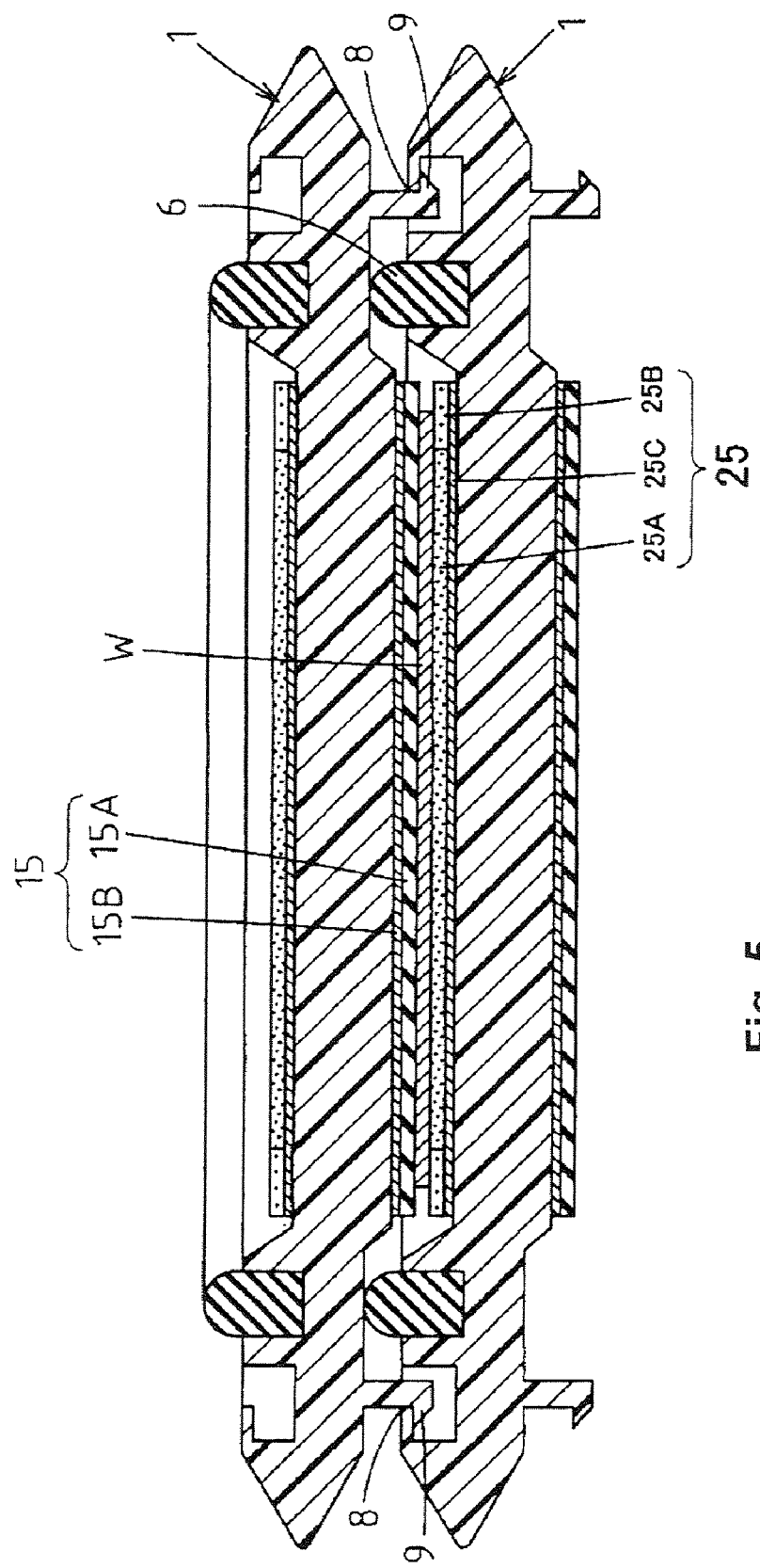
FIG. 5 is a side cross-section view that shows two wafer-mounting trays with stacked wafer-mounting cushion sheets.

FIG. 1 and FIG. 5 show the state where two wafer-mounting trays are separated and the state where they are superposed (stacked), respectively. Though the semiconductor wafer is actually retained by the mounting cushion 25 as shown in FIG. 3, when two wafer-mounting trays are illustrated as being separated as in FIG. 1, the semiconductor wafer is separated independently to clearly show the semiconductor wafer.

A wafer pressing cushion sheet 15 (hereinafter called "pressing sheet") with elasticity, with which the semiconductor wafer is pressed on the mounting cushion of the lower wafer-mounting tray 1, is fixed on the back side of the wafer-mounting tray 1. The pressing sheet 15 in this embodiment is formed in a disc shape with a size to allow it to press a predefined region or roughly the entire surface of the semiconductor wafer by a material that does not chemically influence the semiconductor wafer like the mounting cushion 25.

In particular, the pressing sheet 15 contacts the semiconductor wafer in the state where it is pressed on the surface of the semiconductor wafer, and functions as an elastic cushion. For example, the pressing sheet 15 is constructed by combining an elastomeric polymer sheet 15A such as a urethane foam or a urethane resin, and a base material sheet 15B comprising a material such as PET (Polyethylene terephthalate) that is fixed underneath the back side (the bottom surface) 14 of the wafer cushion tray 1. It is preferable that a face of the pressing sheet contacting the semiconductor wafer is slightly concavo-convex so as not to adhere to the semiconductor wafer. The method to fix the pressing sheet 15 to the wafer-mounting tray 1 is preferably the same as the method to fix the mounting cushion 25 to the wafer-mounting tray 1. That is, although the pressing sheet 15 is fixed on the back side 14 of the wafer-mounting tray 1 in this embodiment, the pressing sheet 15 can be constructed so as to be easily attached to or removed from the wafer mounting tray 1, and can be easily washed and exchanged by using the removeably fixable frames or pins in the bottom surface of the wafer-mounting tray 1.

In the wafer container with the cushion sheets of the embodiment constructed in this manner, when the semiconductor wafers W are conveyed and stored, as shown in FIG. 5, each of them is sandwiched between the mounting cushion 5 and the pressing cushion 15 that possess excellent cushioning characteristics, and is safely housed in the interior space formed between the wafer-mounting tray 1 and the adjacent upper wafer-mounting tray 1.

Even if two superposed wafer-mounting trays 1 are separated, and even if the wafer-mounting trays incline when separated or the semiconductor wafer is inspected, the mounting cushion 25 is in no danger of slipping from the wafer-mounting tray 1 and the semiconductor wafer is in no danger of slipping from the mounting cushion 25 since the semiconductor wafer W is retained by the self-sucking portions of the mounting cushion 25 as shown in FIG. 3. Also, the semiconductor wafer W is always kept flat without warpage because the semiconductor wafer W is fixed on the upper surface of the mounting cushion 25. Accordingly, the semiconductor wafer W can be preliminarily prevented from being broken and damaged due to repeated warping.

A method to remove the semiconductor wafer from the wafer-mounting tray 1 is now explained. Since the fixing force of the mounting cushion exerted on the outer circumference part of the semiconductor wafer W is smaller than that of the mounting cushion retaining the central part of the semiconductor wafer W, the outer circumference part of the semiconductor wafer W is removed from the outer circumference part of the mounting cushion by applying the force removing the semiconductor wafer from the mounting cushion 25 to the entire semiconductor wafer W. Consequently, since air sequentially enters the fine suction discs of the self-sucking portions from the voids made between the outer edges of the semiconductor wafer and the mounting cushion, and the fixing force of the self-sucking portions disappears, the semiconductor wafer can be removed from the mounting cushion 25 without warping and can be taken out of the wafer-mounting tray 1.

Figure 6:
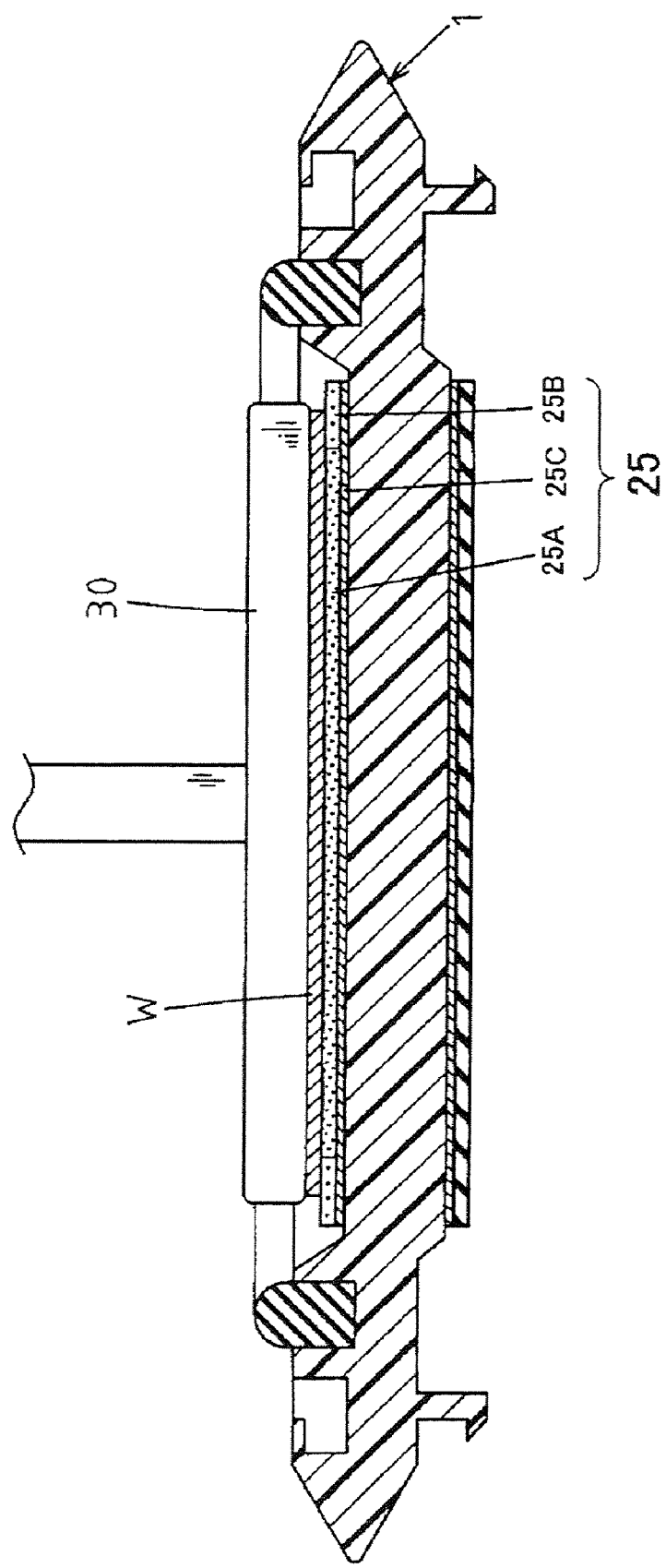
FIG. 6 is a side cross-section view that shows a semiconductor wafer being removed from a wafer-mounting tray with wafer-mounting cushion sheets by a transfer vacuum chuck.

FIG. 6 shows the state where a transfer chuck 30 to remove the semiconductor wafer from the wafer-mounting tray 1 is exerting a vacuum on the upper open face of the semiconductor wafer W. Since the wafer-mounting tray 1 is constructed so that all or a part of the region in the mounting cushion 25 where the area density of the self-sucking portions is small is inside of the outer edge of the transfer chuck 30, the outer edge portion of the semiconductor wafer W retained by the region in the mounting cushion 25 where the area density of the self-sucking portions is small is lifted by the transfer chuck 30, and as described above, the semiconductor wafer W can be easily removed from the mounting cushion 25. That is, when the force exerted by which the transfer chuck 30 on the semiconductor wafer is constant, once a part of the semiconductor wafer W leaves the mounting cushion 25, since the entire force exerted by which the transfer chuck 30 on the semiconductor wafer become smaller, the semiconductor wafer W can be easily removed from the mounting cushion 25. As the transfer chuck 30, a chuck such as so-called Bernoilli hand that contactlessly retains the carried objects (the semiconductor wafer) using a lower pressure which can be generated by flowing air on the carried objects (the semiconductor wafer.), or a so-called electrostatic hand using a fixing force by static electricity can be used.

Figure 7:
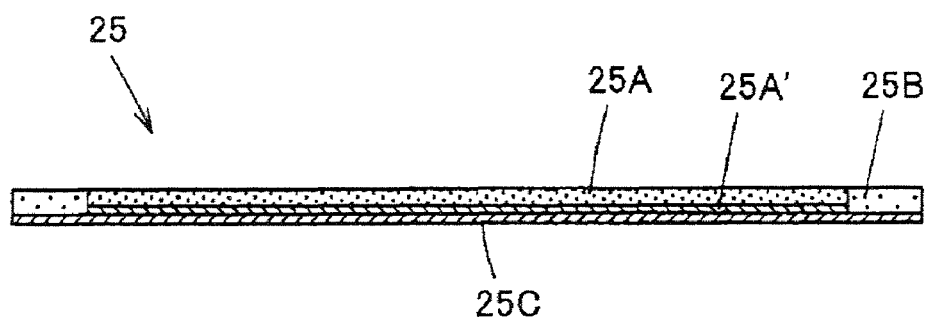
FIG. 7 is a side cross-section view of the first application, which shows a layer structure of a wafer-mounting cushion sheet.
Figure 8:
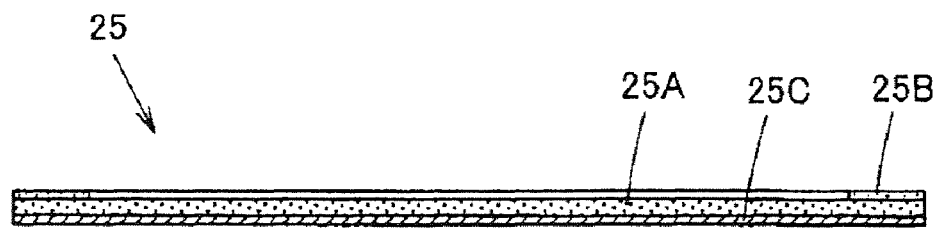
FIG. 8 is a side cross-section view of the second application, which shows a layer structure of a wafer-mounting cushion sheet.

This invention is not limited by the embodiments described above. For example, as the construction of the mounting cushion 25, a sheet 25B may be attached, where the area density of the self-sucking portions is small, on the outer periphery part of the mounting cushion 25 and arrange a sheet 25A, where the area density of the self-sucking portions is large, and a base material sheet 25A' for the sheet 25A inside the sheet 25B, on the base material sheet 25C for the entire mounting cushion 25, as shown in FIG. 7. In this case, it is also desirable that the sheet 25A is almost the same height as the sheet 25B. Also, as shown in FIG. 8, by attaching the ultra thin (for example, approximately 10 to 20 micrometers) sheet 25B, where the area density of the self-sucking portions is small, on the surface of the outer edge part of the sheet 25A, where the area density of the self-sucking portions is large, the sheet 25A and the sheet 25B may be superposed and unified.

In this case, although the sheet 25A is slightly different in height from the sheet 25B, since the sheet 25B is very thin, the difference of their heights does not influence the area density of the self-sucking portions. If the influence is not small, the reciprocal area densities of the self-sucking portions may be adjusted. That is, the area density of the self-sucking portions may be decreased compared to the case where both surfaces of the sheet 25A and the sheet 25B are flat.

Figure 9:
FIG. 9 is a side cross-section view of the third application, which shows a layer structure of a wafer-mounting cushion sheet.

Alternatively, the sheet 25B where the area density of the self-sucking portions is small may be formed by converting a part of the surface of the sheet 25A, where the area density of the self-sucking portions is large, into the non-sucking portions, for example, as shown in FIG. 9, by making the surface of the outer edge part concavo-convex. Such a concavo-convex face can be formed by, for example, the so-called searing method to press a heated metal plate on a resin material.

For the region of the sheet 25B where the area density of the self-sucking portions is small, when the semiconductor wafer is put on the mounting cushion 25, it is placed so that the sheet 25B exists at the position facing a part or all of the outer edge portions of the semiconductor wafer. Consequently, the semiconductor wafer W can be removed from the self-sucking portions without warping since air is blown from the outer edge side into the fine suction discs of the mounting cushion 25 when the semiconductor wafer W is removed from the mounting cushion. The relation of the transfer chuck 30 is the same as above. That is, a part or all of the region 25B, where the area density of the self-sucking portions is small, may be formed inside the outer edge of the transfer chuck 30.

Next, the examples of the array in the self-sucking portions and the non-sucking portions of the mounting cushion are explained.

Figure 13:
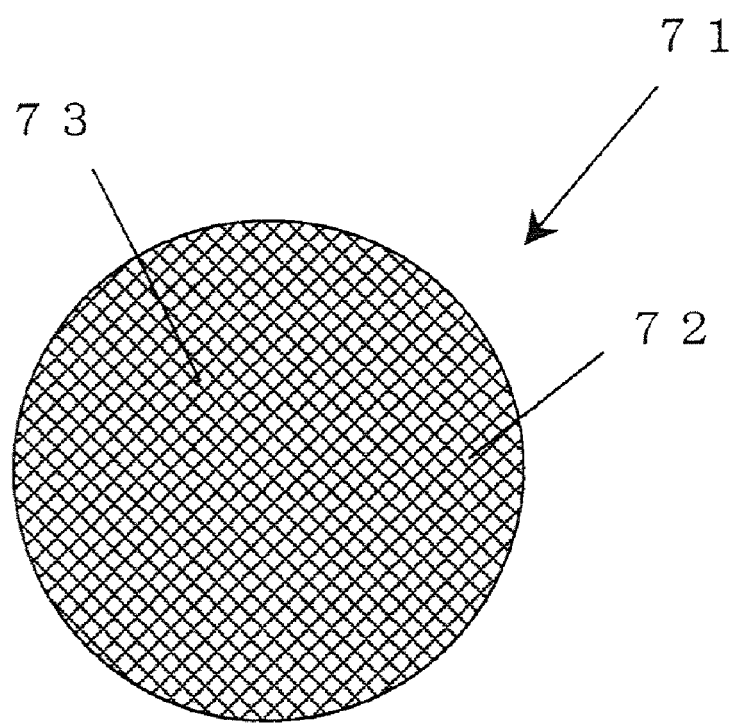
FIGS. 13(a) and 13(b) are schematic diagrams that show an array structure of the self-sucking portions and the non-sucking portions.
Figure 13:
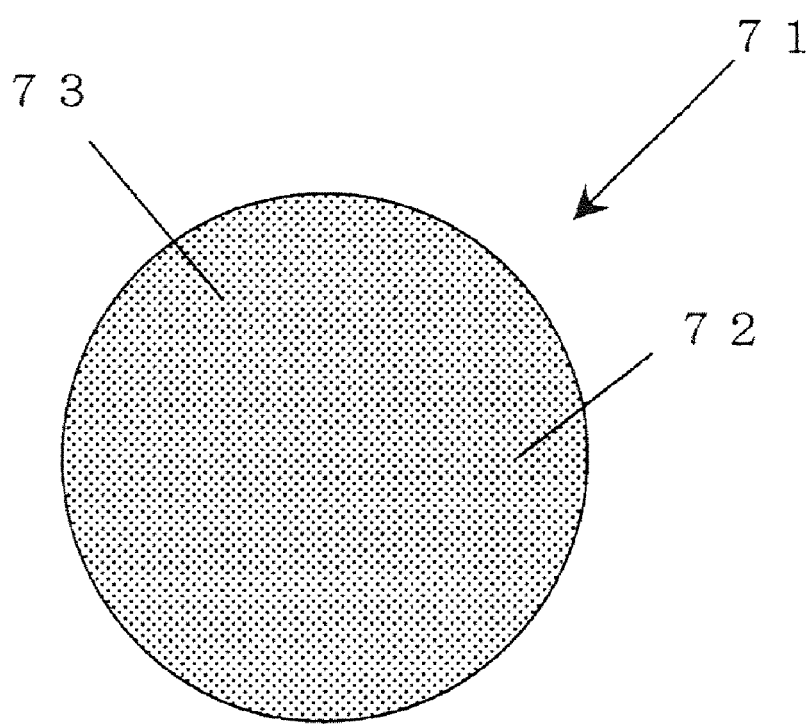

FIGS. 13(*a*) and 13(*b*) are diagrams to explain the array structure of the self-sucking portions and the non-sucking portions in the mounting cushion having a uniform fixing force across the entire face. FIG. 13(*a*) is a diagram in which the self-sucking portions are arrayed in a crisscross manner like a grid on the surface of the mounting cushion 71. Lines and black points 72 are the self-sucking portions and white regions 73 are the non-sucking portions. The semiconductor wafer is put on the surface of the mounting cushion 71. Since the area density of the self-sucking portions is the same throughout the surface of the mounting cushion 71, the fixing force by which the mounting cushion 71 retains the semiconductor wafer is almost uniform throughout the semiconductor wafer. FIG. 13(b) is a diagram in which the self-sucking portions are substantially uniformly arrayed in a dapple shape on the surface of the mounting cushion 71. Black points 72 are the self-sucking portions and white regions 73 are the non-sucking portions. Also in this case, since the area density of the self-sucking portions is the same throughout the surface of the mounting cushion 71, the fixing force by which the mounting cushion 71 retains the semiconductor wafer is almost uniform throughout the semiconductor wafer. As is evident from these arrays, the area density of the self-sucking portions can be varied by varying the distance between the adjacent self-sucking portions (that is, by varying the density of the self-sucking portions).

Figure 14:
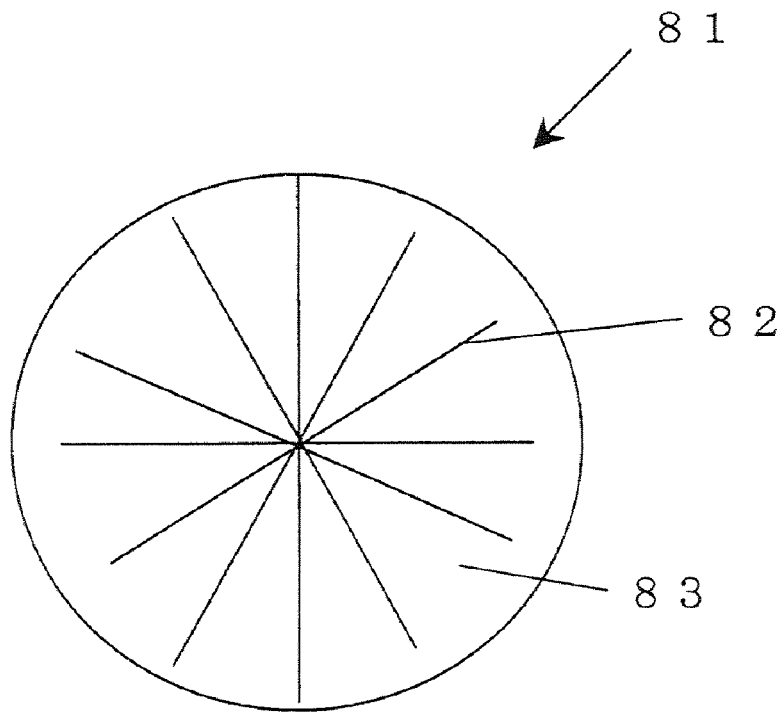
FIGS. 14(a) and 14(b) are schematic diagrams that show an array structure of the self-sucking portions and the non-sucking portions on a surface of a wafer-mounting cushion sheet in one embodiment.
Figure 14:
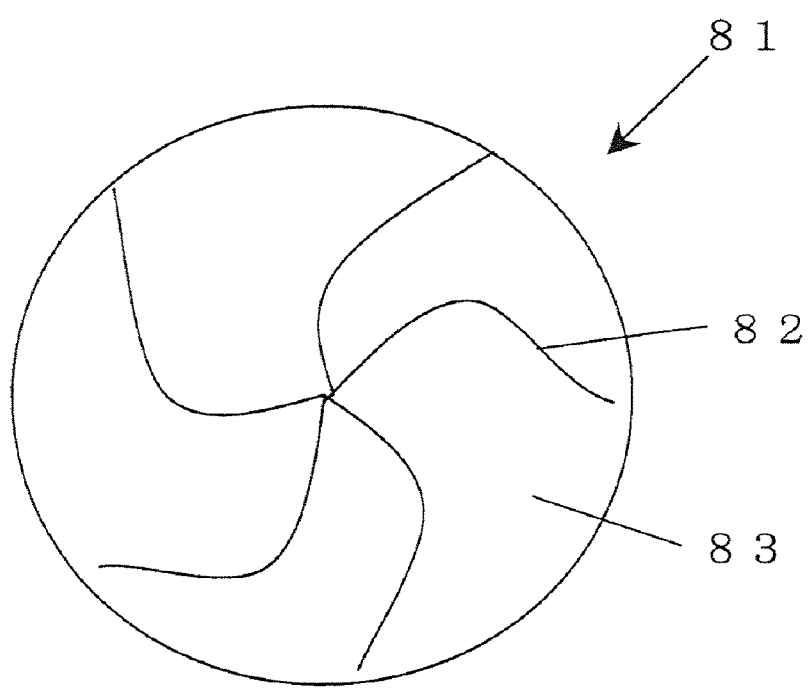

FIGS. 14(a) and 14(b) are diagrams that show an array structure of a self-sucking portion and a non-sucking portion of a surface of a wafer-mounting cushion sheet in another embodiment. In FIG. 14(a), the self-sucking portions 82 are arrayed in a radial line pattern on the surface of the mounting cushion 81. White regions 83 are the non-sucking portions. In FIG. 14(b), the self-sucking portions 82 are arrayed in a spiral pattern on the surface of the mounting cushion 81. In FIG. 14(a) and FIG. 14(b), the self-sucking portions 82 gather together (they are more dense) toward the center of the surface of the mounting cushion 81, while the self-sucking portions 82 are thin (they are less dense) toward the outside of the surface of the mounting cushion 81. Accordingly, the area density of the self-sucking portions is largest near the center of the surface of the mounting cushion 81 and gets smaller toward the outside of the surface of this mounting cushion 81. Since the semiconductor wafer is put on the surface of this mounting cushion 81 (the center of the semiconductor wafer is placed almost on the center of the mounting cushion 81), the fixing force, by which the mounting cushion 81 retains the semiconductor wafer, is large near the central portion of the semiconductor wafer and gets progressively smaller toward the outside of the semiconductor wafer. Therefore, when the semiconductor wafer retained by the mounting cushion 81 is removed from the mounting cushion 81, even if the semiconductor wafer is ultrathined to 100 micrometers or less, it can be safely and easily removed from the mounting cushion without being broken or damaged.

Figure 15:
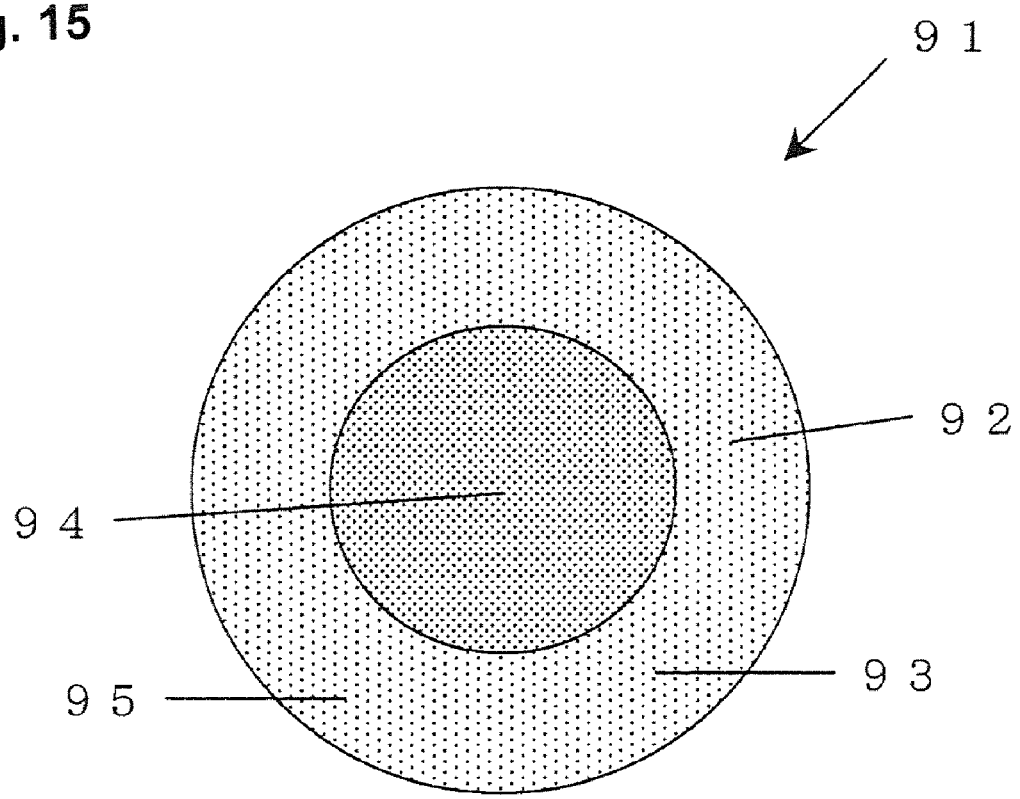
FIG. 15 is a schematic diagram that shows an array structure of the self-sucking portions and the non-sucking portions on a surface of a wafer-mounting cushion sheet in another embodiment.

FIG. 15 is a schematic diagram that shows an array structure of self-sucking portions and non-sucking portions of a surface of a mounting cushion in another embodiment. The self-sucking portions 92 are arrayed in the dapple shape on the surface of the mounting cushion 91 like the case in FIG. 13(b). The black points 92 are the self-sucking portions and the white regions 93 are the non-sucking portions. The area density of the self-sucking portions is large in the central portion of the mounting cushion, while the area density of the self-sucking portions is small in the peripheral portion of the mounting cushion. (Here, the circle inside of the mounting cushion 91 is temporarily drawn so that the border of the central portion and the peripheral portion can be easily distinguished.) By such an array, the fixing force exerted on the peripheral portion of the semiconductor wafer is decreased. Therefore, when the semiconductor wafer retained by the mounting cushion is withdrawn from the mounting cushion, the semiconductor wafer can be gradually withdrawn from the mounting cushion from the outside of the semiconductor wafer toward the center. Consequently, even if the semiconductor wafer is ultrathined to 100 micrometers or less, it can be safely and easily removed from the mounting cushion without being broken or damaged.

As another application of the array relating to the self-sucking portions and the non-sucking portions of the mounting cushion surface shown in FIG. 15, there is a mounting cushion where the area density of the self-sucking portions becomes smaller and smaller from the center of the mounting cushion, which retains the central portion of the semiconductor wafer, toward the outside of the mounting cushion, which retains the outer portion of the semiconductor wafer. In this case, the semiconductor wafer is safely and reliably retained by the mounting cushion. In addition, when the semiconductor wafer retained by the mounting cushion is withdrawn from the mounting cushion, since the semiconductor wafer is gradually withdrawn from the mounting cushion from the outer portions of the semiconductor wafer, where the fixing force retained the semiconductor wafer is small, toward the center of the semiconductor wafer, where the fixing force is larger and larger, it can be safely and easily removed from the mounting cushion without being broken or damaged.

Figure 16:
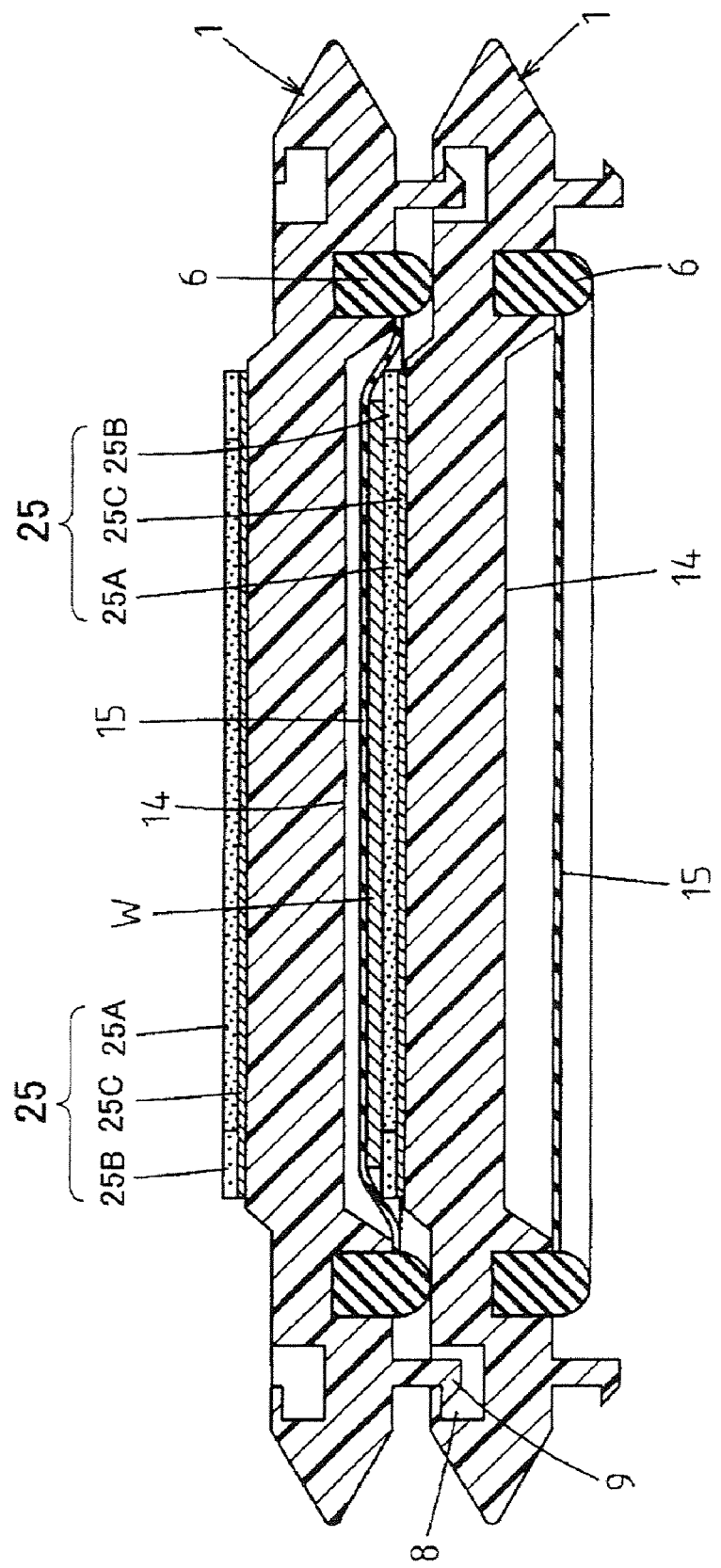
FIG. 16 is a side cross-section view that shows two stacked wafer-mounting trays using the application of wafer-pressing cushion sheets.

Also, as shown in FIG. 16, the pressing sheet 15 may be constructed so that only the outer edge portion is fixed on the wafer-mounting cushion 1 and the other portions float from the back side 14 of the wafer-mounting cushion 1. This allows the semiconductor wafer W to be stored in the state where the cushioning characteristics moderately act on the semiconductor wafer without relation to the thickness of the semiconductor wafer W. Also, the pressing sheet 15 can be formed with single-layer elastomeric polymer sheet or the like. In this case, the face of the pressing sheet 15 contacting the semiconductor wafer W may be formed slightly concavo-convex or the like so not to keep exerting a vacuum force on the semiconductor wafer.

As seen above, though several arrays of the self-sucking portions and the non-sucking portions for the mounting cushion surface have been described, these are only some of the examples. Accordingly, the present invention is not limited by these, and it is understood that other arrays are also included within the scope of the present invention.

As described above the fixing force by which the mounting cushion fixes the semiconductor wafer can be locally changed by changing the area density of the self-sucking portions in the surface of the mounting cushion. Particularly, the semiconductor wafer is reliably fixed by increasing the fixing force, by which the mounting cushion retains the semiconductor wafer, near the center of the semiconductor wafer by increasing the area density of the self-sucking portions near the center of the mounting cushion surface. In addition, the fixing force, by which the mounting cushion retains the semiconductor wafer is decreased in the peripheral portion of the mounting cushion surface by decreasing the area density of the self-sucking portions in the peripheral portions of the mounting cushion surface. Consequently, the semiconductor wafer is steadily retained in the peripheral portion as well as the central portion by the mounting cushion, the semiconductor wafer can be easily removed from the mounting cushion, and even if the thickness of the semiconductor wafer is ultrathined to 100 micrometers or less, the semiconductor wafer can be safely and easily taken out of the wafer-mounting tray without being broken or damaged.

Next, the self-sucking portions formed in the central portion of the wafer mounting sheet, and the non-sucking portions formed at a position facing a part or all of the outer edge portion side of the wafer-mounting cushion sheet that retains the outer edge portion of the semiconductor wafer, which is yet another embodiment (the second embodiment) are discussed in detail. Since the area density of the self-sucking portions is zero in the outer edge portion side of the surface of the wafer-mounting cushion sheet, this embodiment can be regarded as being preferred where the area density of the self-sucking portions in the outer edge portion side of the surface of the wafer-mounting cushion sheet is small. That is, of the several embodiments in which the fixing force by which the wafer-mounting cushion sheet retains the semiconductor wafer can be varied in desirable places of the wafer-mounting cushion sheet by adjusting the area density of the self-sucking portions, the following is preferred.

Figure 17:
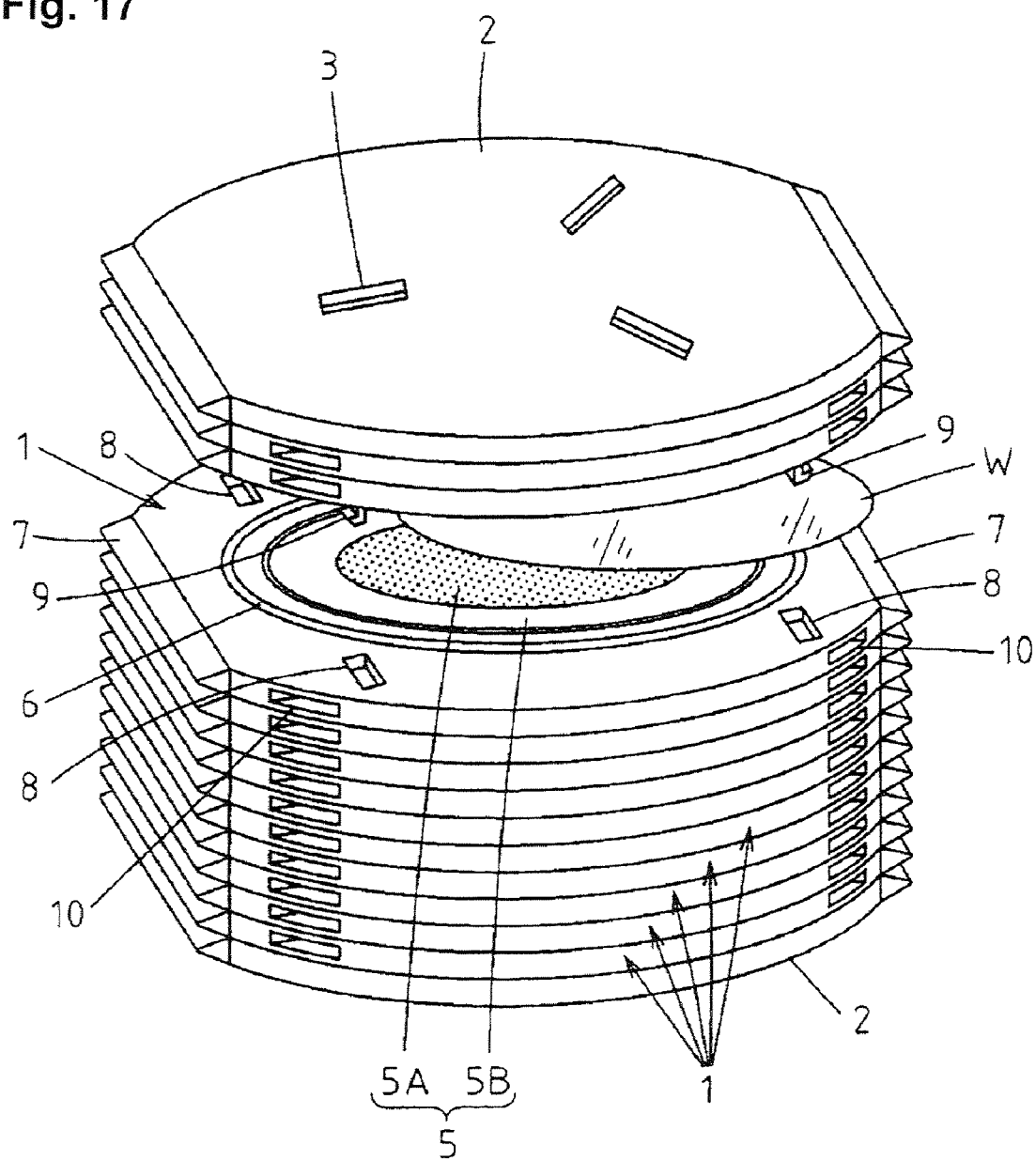
FIG. 17 is a perspective view of a total construction of a wafer container with wafer mounting cushion sheets in a second embodiment where several stacked wafer-mounting trays are separated.

In FIG. 17 that shows the entire construction of the wafer container with cushion sheets, wherein plural wafer-mounting trays 1 to place and store the ultrathin semiconductor wafer W made in a disc shape are horizontally superposed. FIG. 17 is a similar view to FIG. 2 described above, but is different in the structure of the wafer-mounting cushion sheet (hereinafter called "mounting cushion") 5 from FIG. 2. That is, in FIG. 17, the self-sucking portions 5A, which removeably retain the semiconductor wafer, and the non-sucking portions 5B, which maintain the semiconductor wafer in a separable state, are formed on the surface of the mounting cushion 5 which faces the semiconductor wafer W. In the mounting cushion 5, the non-sucking portion surrounds the entire circumference of the disc shaped self-sucking portion 5A.

Figure 18:
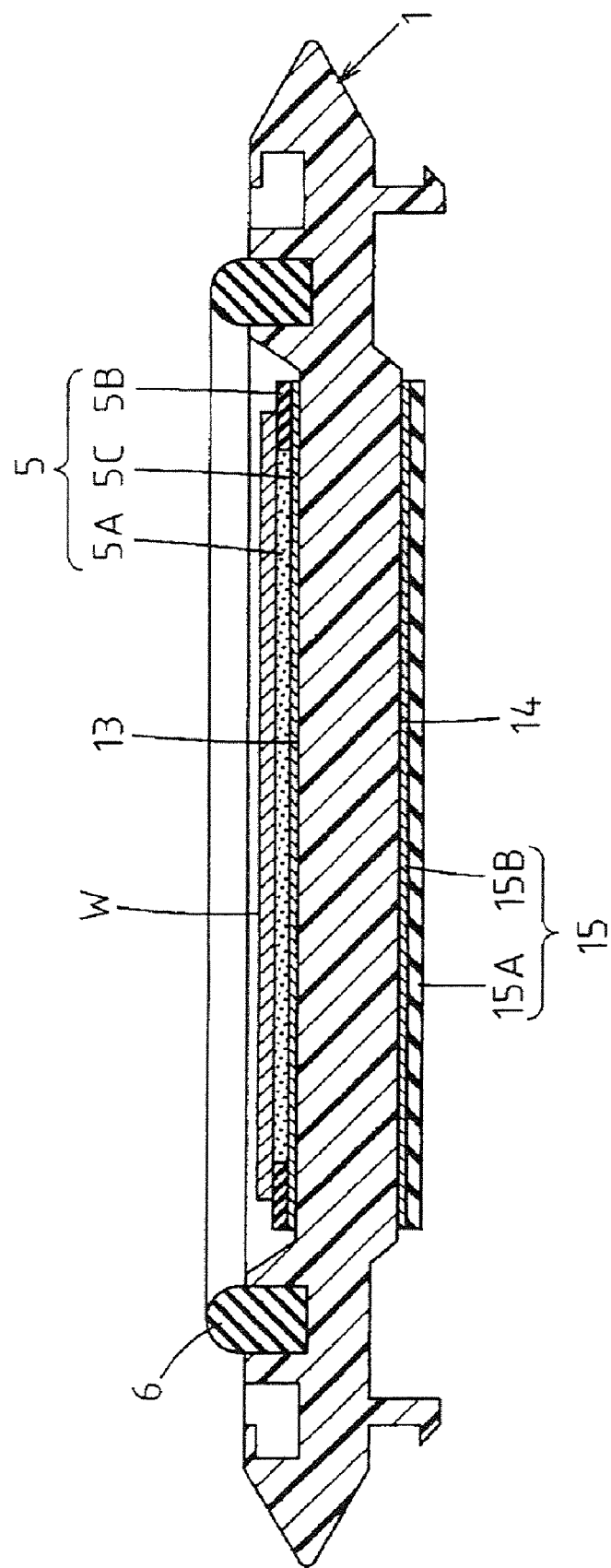
FIG. 18 is a side cross-section view that shows a semiconductor wafer mounted on one wafer-mounting tray with wafer-mounting cushion sheets in the second embodiment.

FIG. 18 shows a state where the semiconductor wafer is put on one of the wafer-mounting trays 1. Though FIG. 18 is a similar view to FIG. 3 described above, it is different in the structure of the mounting cushion from FIG. 3 and prepares the mounting cushion shown in FIG. 17. That is, the mounting cushion includes two stacked and unified layers that are the surface side and back side. In the surface of the mounting cushion 5 which faces the semiconductor wafer W, the non-sucking portions 5B surround the entire circumference of the disc shaped self-sucking portion 5A, while the back side of the mounting cushion 5 which faces the top face 13 of the wafer-mounting tray 1 is formed with the base material sheet 5C made of a material such as PET (Polyethylene terephthalate). As shown in FIG. 18, in this embodiment, the base material sheet 5C is attached to the top face 13 of the wafer-mounting tray 1.

The wafer-mounting tray 1 can be also constructed so that the mounting cushion 5 can be arbitrarily put on and taken off the top face 13 of the wafer-mounting tray 1 by fixing (or removeably fitting) the base material 5C on the frames or pins, which are easily put on and taken off the top face 13 of the wafer-mounting tray 1. Also, the mounting cushion 5 can be three-layer structure by stacking and unifying the same suction layer as the self-sucking portion 6A of the surface side on the back side of the base material sheet. Consequently, the mounting cushion 5 can be constructed so as to be easily put on and taken off the wafer-mounting tray 1 and can be easily washed and exchanged. In this case, the fixing force by which the mounting cushion retains the wafer-mounting tray 1 should be set larger than that by which the mounting cushion retains the semiconductor wafer.

The self-sucking portion 5A is made of a rubber polymer foam material such as an acrylic latex foam comprising an acrylic ester copolymer foam, an elastomeric polymer foam material or a urethane polymer foam material. Each of the outwardly opening air bubbles of the many bubbles formed in the self-sucking portions 5A operates as a fine suction disc. Accordingly, in the self-sucking portions 5A, all aspects exposed to the atmosphere in the self-sucking portion 5A are the fine suction discs. The semiconductor wafer W is subjected to a vacuum and fixed by the self-sucking portion 5A by pressing the fine suction discs on the semiconductor wafer W, which is the other side retained by the fine suction discs. The air bubbles may be either continuous air bubbles or isolated air bubbles. It is desirable that the average diameter of the air bubbles is about 10 micrometers or more and about 50 micrometers or less.

Figure 19:
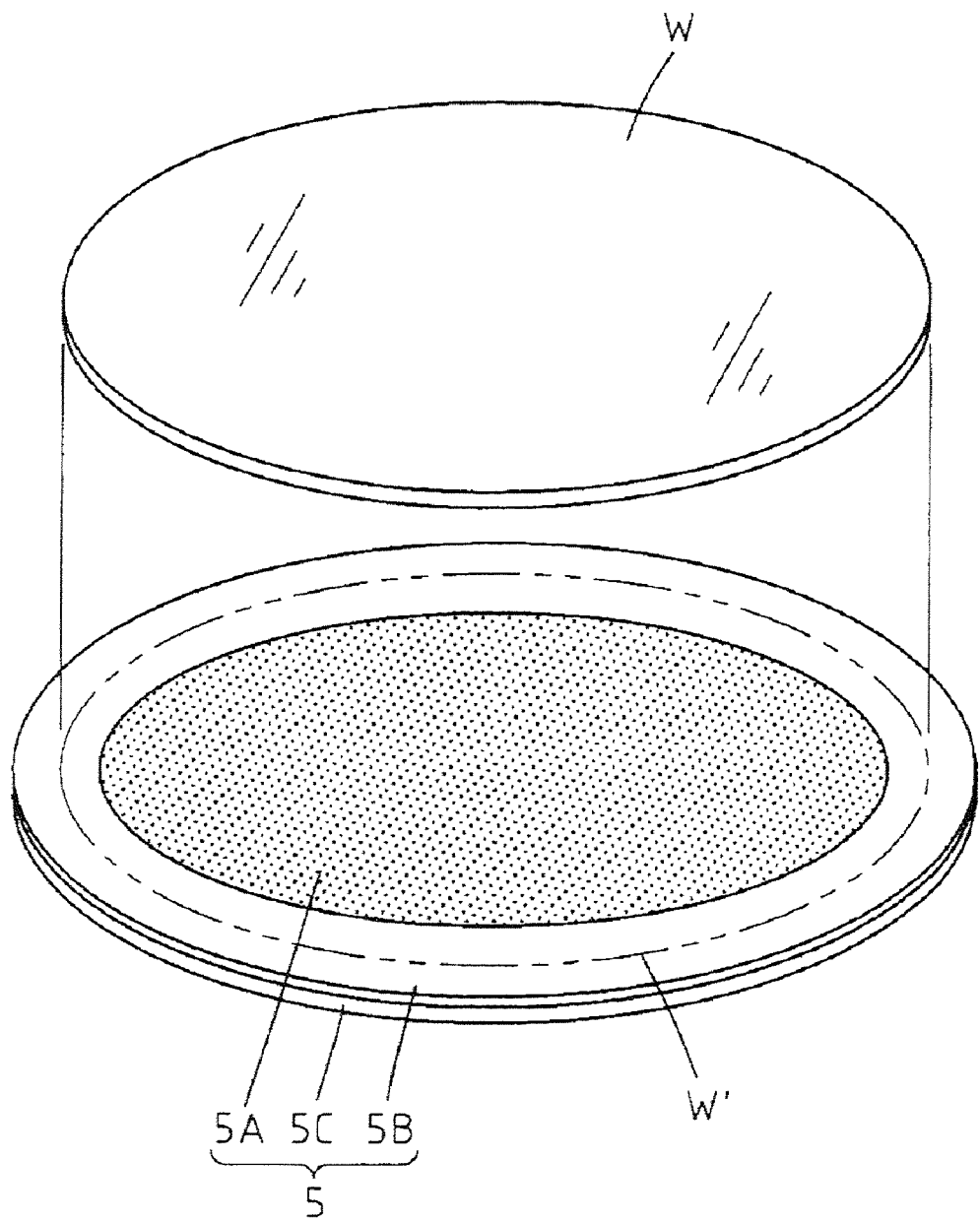
FIG. 19 is a perspective view that shows a wafer-mounting cushion sheet in the second embodiment separated from a semiconductor wafer.

FIG. 19 is a view by which the state of the mounting cushion shown in FIG. 17 and FIG. 18 can be fully comprehended. As shown in FIG. 19, in this embodiment, the self-sucking portion 5A is formed in the disc shape with a smaller diameter than the diameter of the semiconductor wafer W, and the non-sucking portions 5B surround the entire circumference of the self-sucking portions 5A. W' shown by a dashed-two dotted line in FIG. 19 represents the position of the outer edge of the semiconductor wafer in the case where the semiconductor wafer W is put on the mounting cushion 5. Here, the outer edge of the non-sucking portions 5B is formed to be larger than the semiconductor wafer W, and the position W' of the outer edge of the semiconductor wafer W is arranged within the non-sucking portions 5B.

A material which has the comparable cushion characteristics to the self-sucking portion 5A and does not have the self-sucking characteristics, such as a polymer foam material, for example, like a urethane foam, or an elastomeric polymer material, can be used as a material of the non-sucking portion 5B. In FIG. 18, the surface of the non-sucking portions 5B is formed to be the same height as that of the self-sucking portion 5A. Accordingly, when the semiconductor wafer W is pressed on the mounting cushion 5, the semiconductor wafer W can be safely stored strain-freely since a reaction force of the mounting cushion 5 acts uniformly on the entire the semiconductor wafer.

Since the outer edge portion of the semiconductor wafer W faces the non-sucking portions 5B, it is not subjected to a vacuum by the mounting cushion 5. If a force detaching the semiconductor wafer W from the mounting cushion 5 acts on the entire semiconductor wafer W (or in the wide region containing at least the outer edge portion), the fixing force of the self-sucking portions 5A disappears since air sequentially enters the fine suction discs of the self-sucking portion 5A from the voids generated between the outer edge portions of the semiconductor wafer W and the mounting cushion 5. Accordingly, when the semiconductor wafer W is removed from the wafer-mounting tray 1, the semiconductor wafer W can be detached from the mounting cushion 1 and can be taken out of the wafer-mounting tray 1 without warping the semiconductor wafer W.

Figure 20:
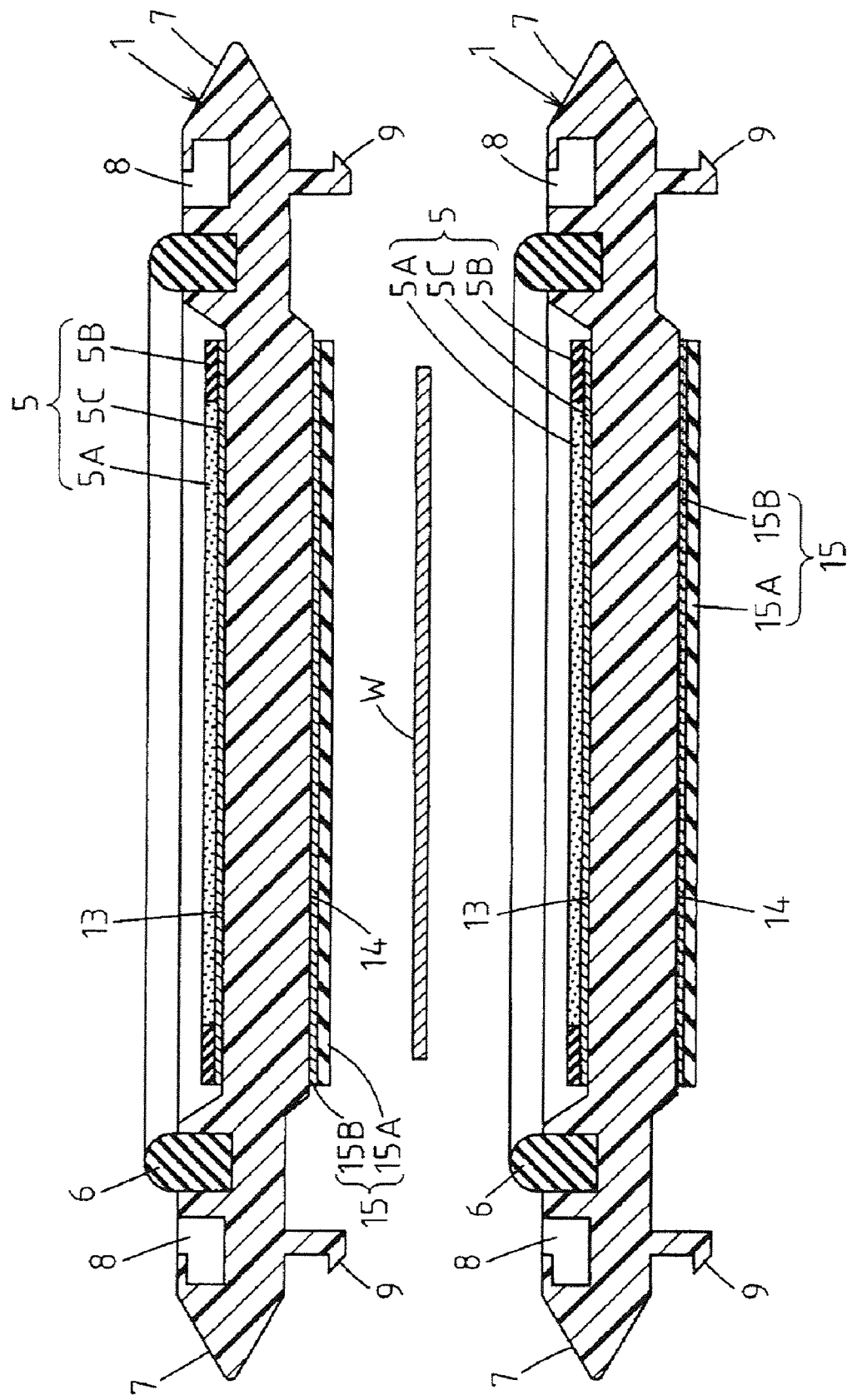
FIG. 20 is a side cross-section view that shows two separated wafer-mounting trays in the second embodiment.
Figure 21:
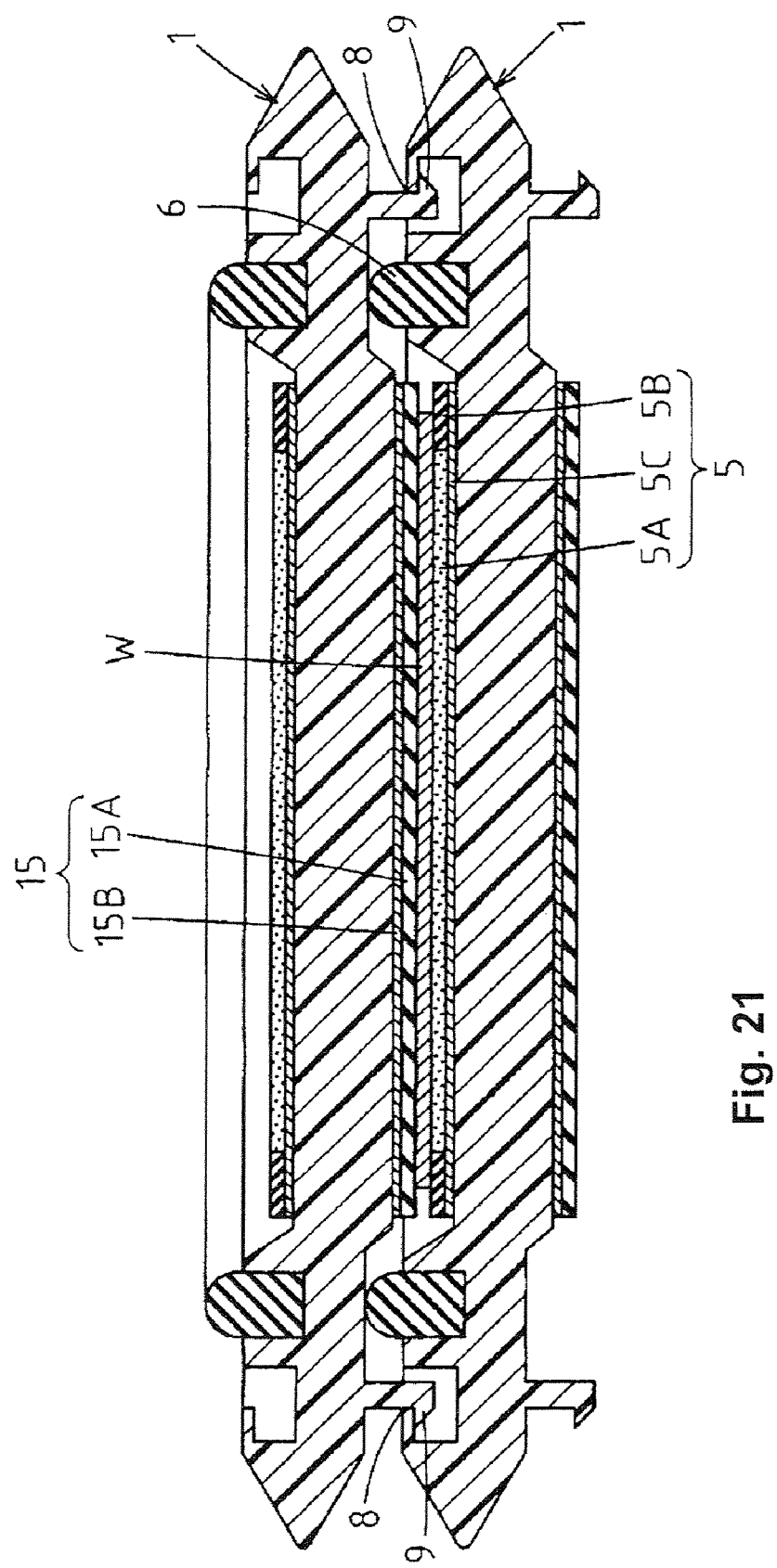
FIG. 21 is a side cross-section view that shows two stacked wafer-mounting trays using wafer-mounting cushion sheets in the second embodiment.

FIG. 20 and FIG. 21 show two wafer-mounting trays 1 that are separated and superposed, respectively. Although the semiconductor wafer W actually keeps being retained by the mounting cushion as shown in FIG. 18 when the two wafer-mounting trays 1 are separated, the semiconductor wafer W is shown to be separated in FIG. 20 in order to definitely illustrate the existence of the semiconductor wafer W. FIGS. 20 and 21 are similar views to FIGS. 1 and 5, respectively, but are different in the structure of the mounting cushion 5.

The wafer pressing cushion sheet 15 (hereinafter called "pressing sheet 15"), which has elasticity and is a sheet to press the semiconductor wafer to the mounting cushion 5 of the lower wafer-mounting tray 1, is fixed on the back side 14 of the wafer-mounting tray 1. The pressing sheet 15 of this embodiment is formed in the shape of a disc with a size to press a desirable region or the almost the entire surface of the semiconductor wafer, and by materials that do not chemically affect the semiconductor wafer.

Specifically, the pressing sheet 15 is stacked, unified and constructed by the elastomeric polymer sheet 15A comprising materials, which function as an elastic cushion by contacting in the state pressed on the surface of the semiconductor wafer W, such as a urethane foam or a urethane resin, and the base material sheet 15B comprising materials such as PET (Polyethylene terephthalate), which is fixed on the back side (lower surface) 14 of the wafer-mounting tray 1. The contact face of the pressing sheet 15 contacting the semiconductor wafer may be formed to be slightly concavo-convex so not to exert a vacuum on the semiconductor wafer. The method to fix the pressing sheet 15 to the wafer-mounting tray 1 is the same as that to fix the mounting cushion 5. That is, though the pressing sheet 15 is attached to the back side 14 of the wafer-mounting tray 1 in this embodiment, the pressing sheet 15 can be constructed to be put on and taken off the wafer-mounting tray 1, and can be easily washed and exchanged by using the frames and pins, which can be put on and taken off the bottom face 14 of the wafer-mounting tray 1.

In the wafer container with the cushion sheets of the embodiment constructed as seen above, when the semiconductor wafer W is carried and stored, as shown in FIG. 21, the semiconductor wafer W is safely housed within the internal space formed between the wafer-mounting tray 1 and the upper wafer-mounting tray 1 superposed adjacently on the upper side in the state where the semiconductor wafer W is resiliently sandwiched between the mounting cushion 5 and the pressing sheet 16 which are highly elastic.

Even if the superposed wafer-mounting trays 1 are separated and the separated wafer-mounting tray 1 is inclined during the separating process or during inspection work of the semiconductor wafer, as shown in FIG. 18, since the semiconductor wafer W is retained by the self-sucking portions 6A of the mounting cushion 6, the mounting cushion 5 is free from the possibility of sliding off the wafer-mounting tray 1 and the semiconductor wafer W is free from the possibility of sliding off the mounting cushion 5. Since the semiconductor wafer W is always kept flat without warping by being constantly fixed on the mounting cushion 6, the semiconductor wafer W can be prevented from breaking and being damaged by repeated warping.

When the semiconductor wafer W is taken out of the wafer-mounting tray 1, since the outer edge portion of the semiconductor wafer W faces the non-sucking portions 5B and is not sucked by the mounting cushion, if the force by which the entire (or the wide range including at least the outer edge portion) of the semiconductor wafer W is withdrawn from the mounting cushion 5, operates, the semiconductor wafer W can be easily withdrawn from the mounting cushion 5 and can be taken out of the wafer-mounting tray 1 without warping, because air enters the fine suction discs of the self-sucking portions 5A from the space generated between the outer edge portions of the semiconductor wafer W and the mounting cushion, therefore the fixing force of the self-sucking portions 5A disappears.

Figure 22:
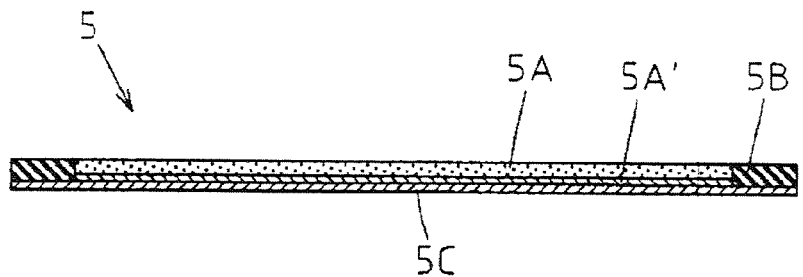
FIG. 22 is a side cross-section view of the first application that shows a layer structure of a wafer-mounting cushion sheet in the second embodiment.
Figure 23:
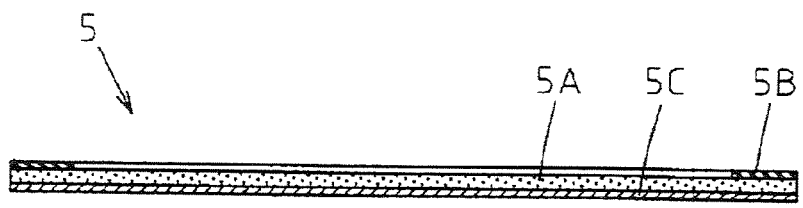
FIG. 23 is a side cross-section view of the second application that shows a layer structure of a wafer-mounting cushion sheet in the second embodiment.
Figure 24:
FIG. 24 is a side cross-section view of the third application that shows a layer structure of a wafer-mounting cushion sheet in the second embodiment.

The present invention is not limited by the embodiments described in FIG. 17 to FIG. 21. For example, as shown in FIG. 22, the basic material sheet 5C for the entire mounting cushion 5 and the basic material sheet 5A' for the self-sucking portion 5A may be separately set in the constitution of the mounting cushion 5. Also, as shown in FIG. 23, the self-sucking portions 5A and the non-sucking portions 5B may be stacked and unified in the state where the non-sucking portion 5B, which is ultrathin (for example, approximately 10 to 20 micrometers) and does not have the retaining characteristics, is put on the surface of the outer edge portion of the self-sucking portions 5A. Alternatively, as shown in FIG. 24, the non-sucking portion 5B may be formed so that a part of the surface of the self-sucking portions 5A has the non-sucking characteristics. Aspects such as the concavo-convex aspects can be formed by, for example, the so-called branding iron in which a heated metal plate or the like is pressed on a resin material.

Also, as a region where the non-sucking portion is formed, if the non-sucking portions 5B are formed to exist at the position that faces at least a part or all of the outer edge portion of the semiconductor wafer W when the semiconductor wafer is put on the mounting cushion 5, air enters the fine suction discs of the mounting cushion from the outer edge portion, and as a result the semiconductor wafer W can be removed from the self-sucking portion 3A without warping. The relation between the mounting cushion and the transfer chuck is similar to the above, that is, a part of or all of the self-sucking portions 5A may be formed inside the outer edge of the transfer chuck.

Figure 25:
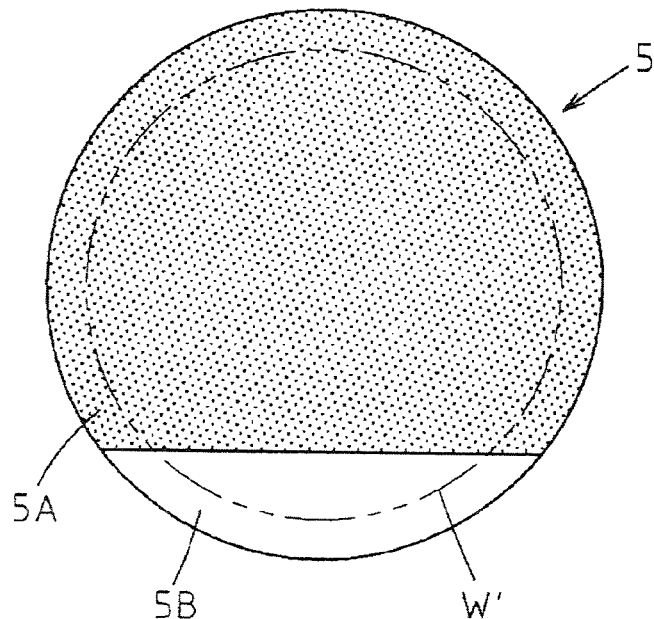
FIG. 25 is a plan view of the first application that shows an arrangement of the self-sucking portions and the non-sucking portions in a wafer-mounting cushion sheet of the second embodiment.
Figure 26:
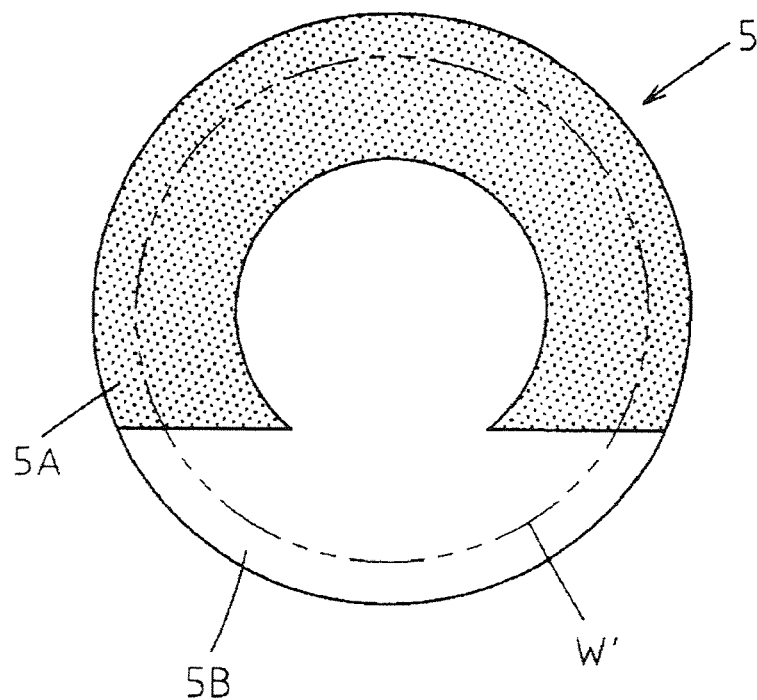
FIG. 26 is a plan view of the second application that shows an arrangement of the self-sucking portions and the non-sucking portions in a wafer-mounting cushion sheet of the second embodiment.
Figure 27:
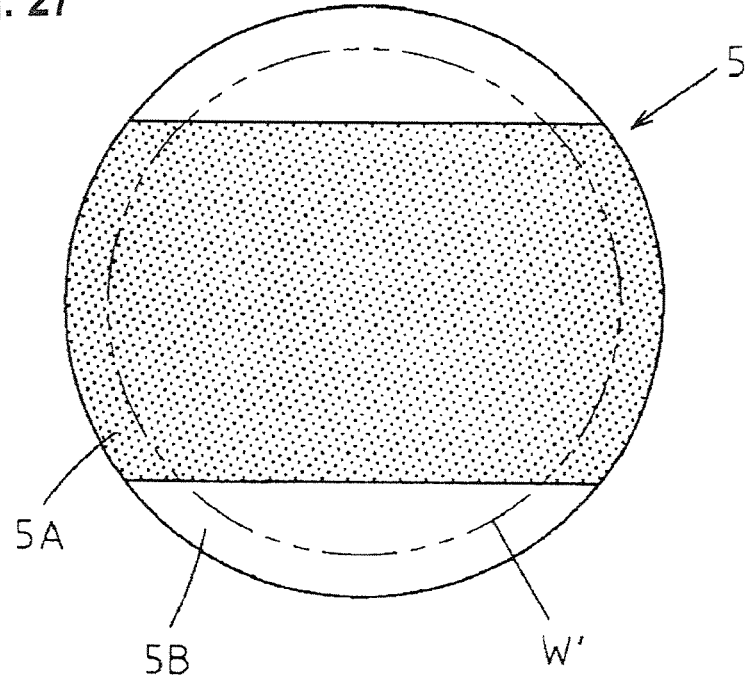
FIG. 27 is a plan view of the third application that shows an arrangement of the self-sucking portions and the non-sucking portion in a wafer-mounting cushion sheet of the second embodiment.
Figure 28:
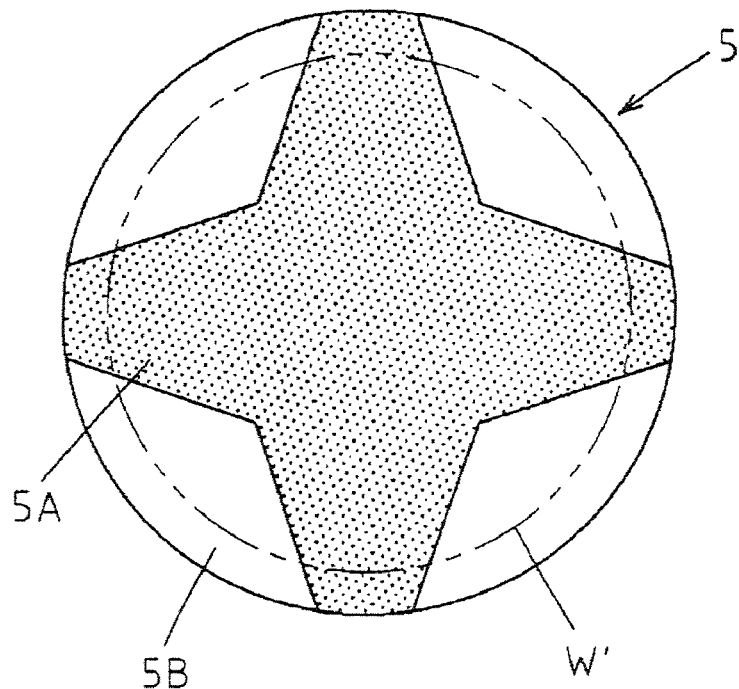
FIG. 28 is a plan view of the fourth application that shows an arrangement of the self-sucking portions and the non-sucking portions in a wafer-mounting cushion sheet of the second embodiment.
Figure 29:
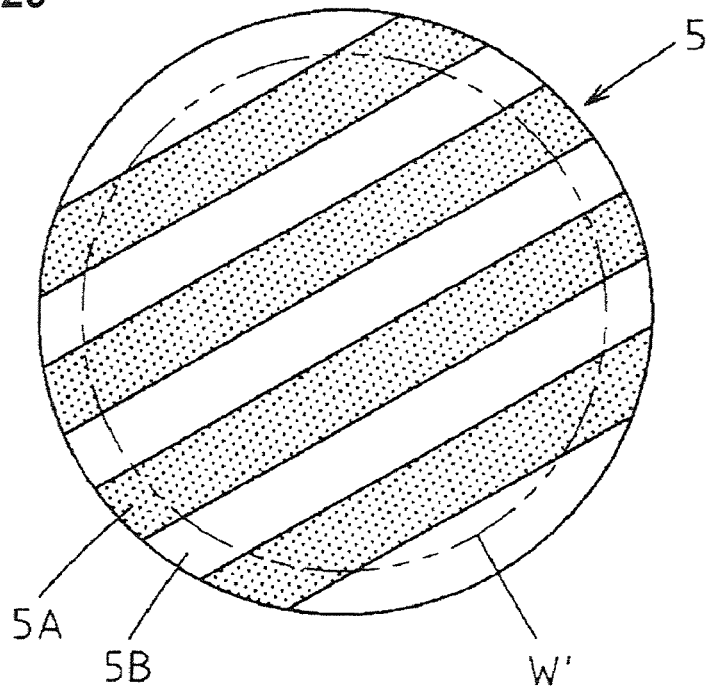
FIG. 29 is a plan view of the fifth application that shows an arrangement of the self-sucking portions and the non-sucking portions in a wafer-mounting cushion sheet of the second embodiment.
Figure 30:
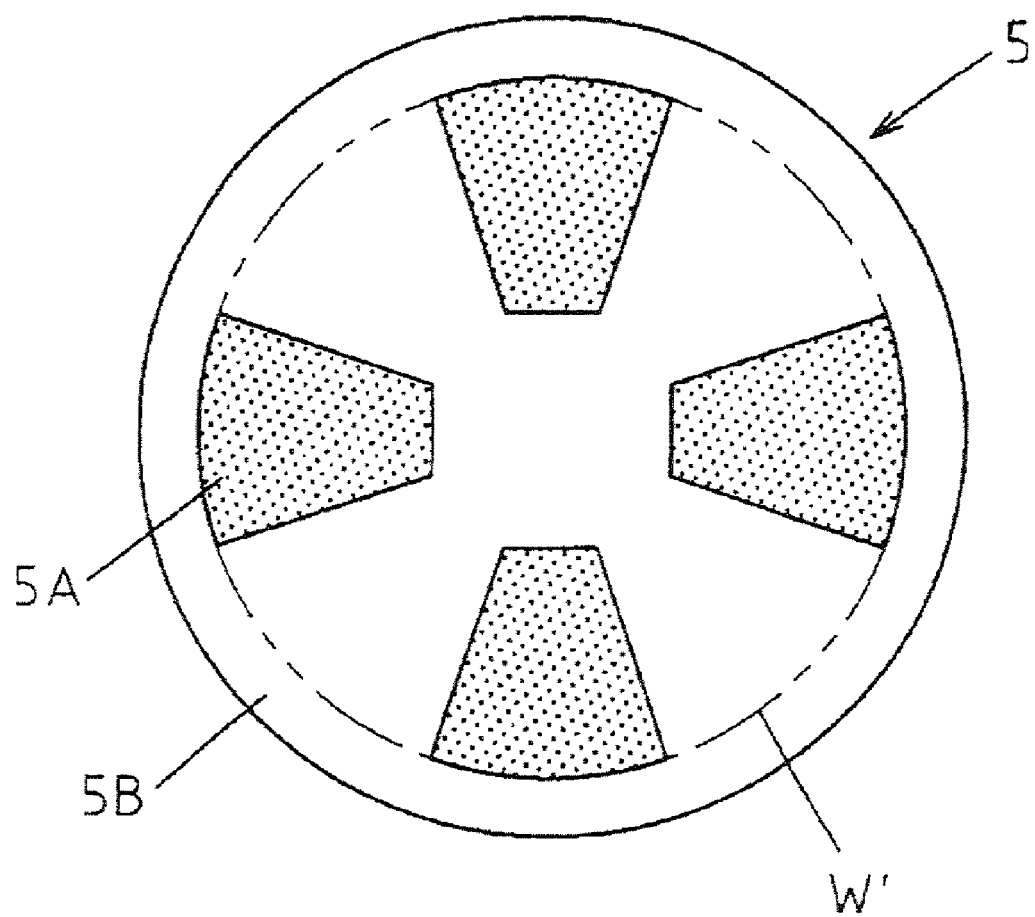
FIG. 30 is a plan view of the sixth application that shows an arrangement of a self-sucking portion and a non-sucking portion in a wafer-mounting cushion sheet of the second embodiment.

FIGS. 25 to 30 show the examples in which the arrangements of the self-sucking portions 5A and the non-sucking portions 5B in the mounting cushion 5 are varied. As shown in FIG. 25, the non-sucking portions 5B may be formed on only a part of the outer edge portion of the mounting cushion 5. Alternatively, as shown in FIG. 26, the shape of the self-sucking portions 5A may be like a "c" character or the like. As shown in FIGS. 27 and 28, the non-sucking portions 5B may be separated in plural regions at positions facing the outer edge portions of the mounting cushion 5. Also, the self-sucking portions 5A may be separated in plural regions at positions facing the semiconductor wafer. For example, as shown in FIG. 29, the self-sucking portions 5A and the non-sucking portions 5B are alternately formed in a stripe pattern, or as shown in FIG. 30, the self-sucking portions 5A may be formed in plural island shapes.

The first embodiment described above can be considered as the state where many non-sucking portions exist in the embodiment in which the non-sucking portions shown in FIGS. 27 to 30 are separated in plural regions.

Although several methods and structures to form the non-sucking portions 5B at the position facing a part or all of the outer edge portion of the semiconductor wafer has been described, since these are only some examples, it goes without saying that the present invention is not limited by these and that other methods and structures are included within the scope of the present invention.

Though the plates of the mounting cushion and the semiconductor wafer are described as circular shapes in the above descriptions, it is understood that they can be also applied to a polygonal shape such as a rectangular shape or a square shape besides the circular shape, and the other shapes. The present invention can be also applied in the field in which thin substrates besides semiconductor wafer are used, such as a display device field or a solar cell field. Even if the descriptions written in each of the embodiments described above are not described in the other embodiments, it is understood that they can be applied in all embodiments when they are mutually compatible.

Regarding an industrial applicability, the invention can be applied in the semiconductor industry in which a wafer container is employed to carry and store semiconductor wafers.

What is claimed is:

1. A wafer container with a wafer mounting sheet comprising:
   a plurality of stacked wafer mounting trays that form interior spaces between adjacent wafer mounting trays; and
   an elastic wafer mounting cushion sheet in each interior space and adapted to retain a semiconductor wafer therein,
   wherein a surface of the wafer mounting cushion sheet includes self-sucking portions and non-sucking portions, said self-sucking portions selectively exert a vacuum on the semiconductor wafer, a fixing force by which the wafer mounting cushion sheet retains the semiconductor wafer is adjusted by varying an area density of the self-sucking portions, and the area density of the self-sucking portions varies by location across the wafer mounting cushion sheet.

2. The wafer container with a wafer mounting sheet according to claim 1, wherein the area density of the self-sucking portions in an outer circumference part of the wafer mounting cushion sheet, which retain an outer circumference part of the semiconductor wafer, is smaller than that of the self-sucking portions in the central part of the wafer mounting cushion sheet, which retain a central part of the semiconductor wafer.

3. The wafer container with a wafer mounting sheet according to claim 2, wherein the area density of the self-sucking portions in the wafer mounting cushion sheet reduces from the central part of the wafer mounting cushion sheet toward the outer circumference part of the wafer mounting cushion sheet, which suck the outer circumference part of the semiconductor wafer.

4. The wafer container with a wafer mounting sheet according to claim 1, wherein at least a part of a region where the area density of the self-sucking portions is small is inside an outer edge of a transfer chuck that removes the semiconductor wafer from the wafer mounting cushion.

5. The wafer container with a wafer mounting sheet according to claim 1, wherein a surface of the non-sucking portions is substantially level with a surface of the self-sucking portions.

6. The wafer container with a wafer mounting sheet according to claim 1, wherein the non-sucking portions comprise a sheet with non-sucking characteristics layered on a surface of the self-sucking portions.

7. The wafer container with a wafer mounting sheet according to claim 1, wherein the non-sucking portions comprise a part of a surface of the self-sucking portions that is converted to have non-sucking characteristics.

8. The wafer container with a wafer mounting sheet according to claim 1, wherein the non-sucking portions comprise a concavo-convex part of a surface of the self-sucking portions.

* * * * *